United States Patent
Mushano

(10) Patent No.: US 8,035,852 B2
(45) Date of Patent: Oct. 11, 2011

(54) FRAME DATA PRODUCING APPARATUS, METHOD AND PLOTTING APPARATUS

(75) Inventor: Mitsuru Mushano, Hino (JP)

(73) Assignee: Fujifilm Corporation, Tokyo (JP)

(*) Notice: Subject to any disclaimer, the term of this patent is extended or adjusted under 35 U.S.C. 154(b) by 873 days.

(21) Appl. No.: 11/992,391

(22) PCT Filed: Sep. 28, 2006

(86) PCT No.: PCT/JP2006/319372
§ 371 (c)(1),
(2), (4) Date: Mar. 21, 2008

(87) PCT Pub. No.: WO2007/037344
PCT Pub. Date: Apr. 5, 2007

(65) Prior Publication Data
US 2009/0161173 A1    Jun. 25, 2009

(30) Foreign Application Priority Data
Sep. 29, 2005   (JP) .................................. 2005-284716

(51) Int. Cl.
*G06F 15/00* (2006.01)
(52) U.S. Cl. .......................................... 358/1.8; 347/50
(58) Field of Classification Search ............... 358/1.8, 358/1.15, 1.18, 1.1, 3.06, 3.13, 1.16, 3.28; 156/385, 384; 270/58.07, 58.08; 347/50, 347/57, 12, 14; 235/462.49, 375, 435
See application file for complete search history.

(56) References Cited

U.S. PATENT DOCUMENTS
6,606,739 B2    8/2003   Kanatake et al.
7,187,467 B2 *   3/2007   Takahashi et al. ............ 358/1.18

FOREIGN PATENT DOCUMENTS
| JP | 2003-337425 | 11/2003 |
| JP | 2004-56100 | 2/2004 |
| JP | 2005-22249 | 1/2005 |
| JP | 2005-22250 | 1/2005 |
| JP | 2006-264319 | 10/2006 |
| JP | 2006-309200 | 11/2006 |
| JP | 2006-323330 | 11/2006 |
| JP | 2006-323378 | 11/2006 |

* cited by examiner

*Primary Examiner* — Saeid Ebrahimi Dehkordy
(74) *Attorney, Agent, or Firm* — McGinn IP Law Group, PLLC

(57) ABSTRACT

A micro-mirror unit of data from a plot point formation element unit data to a plot unit of frame data. A micro-mirror unit of data to be sequentially supplied to a plurality of micro-mirrors is produced from an image data corresponding to an image to be formed in a plot screen by use of DMDs each having the plurality of micro-mirrors. An intermediate data is then produced by extracting data change points of the produced micro-mirror unit of data. The data is inverted for each of the data change points in the produced intermediate data, thereby performing the transportation from the micro-mirror unit of data to the DMD unit of frame data.

8 Claims, 22 Drawing Sheets

FIG. 8

|  | | | | | | | | | | | | | | 102 |
|---|---|---|---|---|---|---|---|---|---|---|---|---|---|---|
| LINE 8 | 0 | 0 | 0 | 0 | 0 | 0 | 0 | 0 | 0 | 0 | 0 | 0 | 0 | 0 |
| LINE 7 | 0 | 0 | 1 | 1 | 1 | 0 | 0 | 0 | 1 | 1 | 1 | 0 | 0 |
| LINE 6 | 0 | 0 | 1 | 1 | 1 | 0 | 0 | 0 | 1 | 1 | 1 | 0 | 0 |
| LINE 5 | 0 | 0 | 0 | 1 | 1 | 1 | 1 | 1 | 1 | 0 | 0 | 0 |
| LINE 4 | 0 | 0 | 0 | 1 | 1 | 1 | 1 | 1 | 1 | 0 | 0 | 0 |
| LINE 3 | 0 | 0 | 1 | 1 | 1 | 0 | 0 | 0 | 1 | 1 | 1 | 0 | 0 |
| LINE 2 | 0 | 0 | 1 | 1 | 1 | 0 | 0 | 0 | 1 | 1 | 1 | 0 | 0 |
| LINE 1 | 0 | 0 | 0 | 0 | 0 | 0 | 0 | 0 | 0 | 0 | 0 | 0 | 0 | 0 |

FIG. 9

| | 104 |
|---|---|
| LINE 8 | 16 |
| LINE 7 | 2,4,4,4,2 |
| LINE 6 | 2,4,4,4,2 |
| LINE 5 | 4,8,4 |
| LINE 4 | 4,8,4 |
| LINE 3 | 2,4,4,4,2 |
| LINE 2 | 2,4,4,4,2 |
| LINE 1 | 16 |

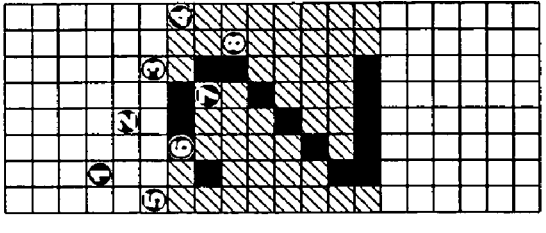
FIG. 16A  FRAME 1
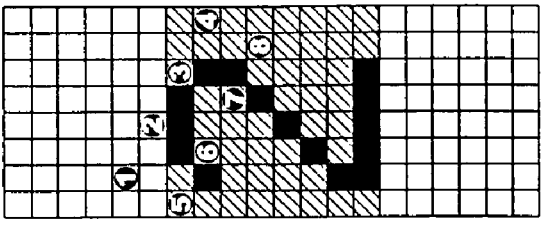
FIG. 16B  FRAME 2
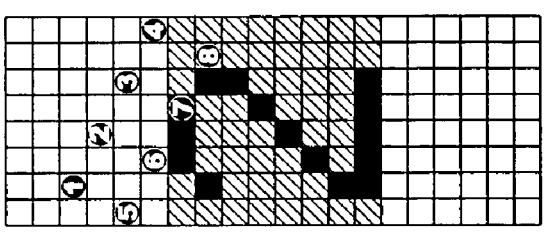
FIG. 16C  FRAME 3
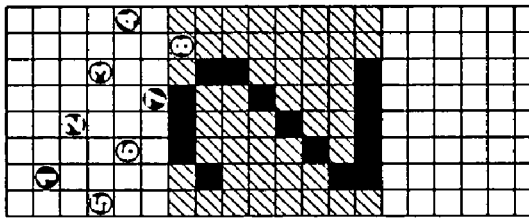
FIG. 16D  FRAME 4
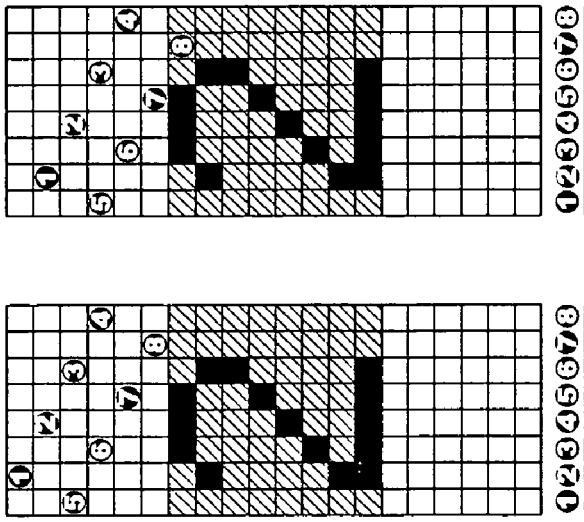
FIG. 16E  FRAME 5
DIRECTION OF SUCCESSIVE ADDRESSES
SCANNING DIRECTION

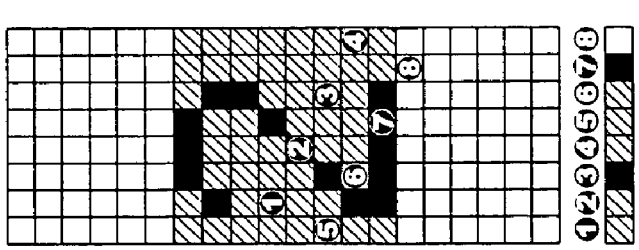
FIG. 17A    FIG. 17B    FIG. 17C    FIG. 17D    FIG. 17E
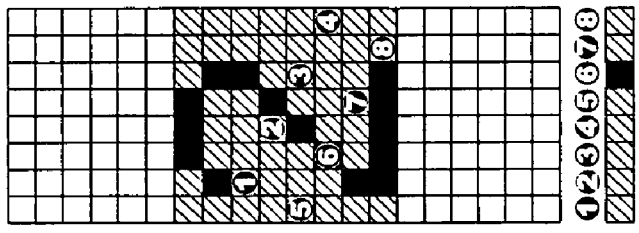
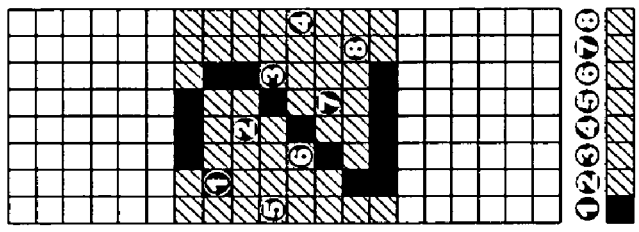
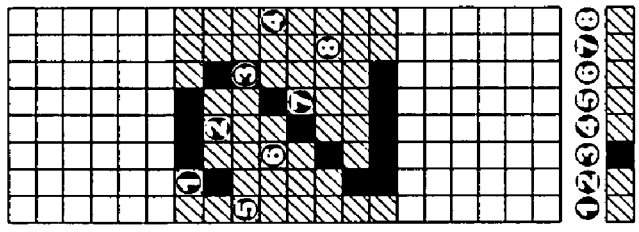
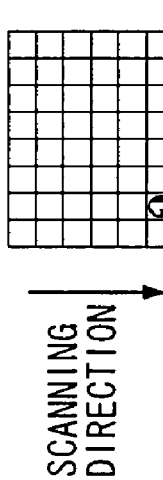
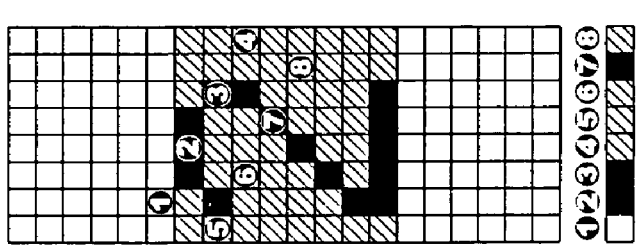

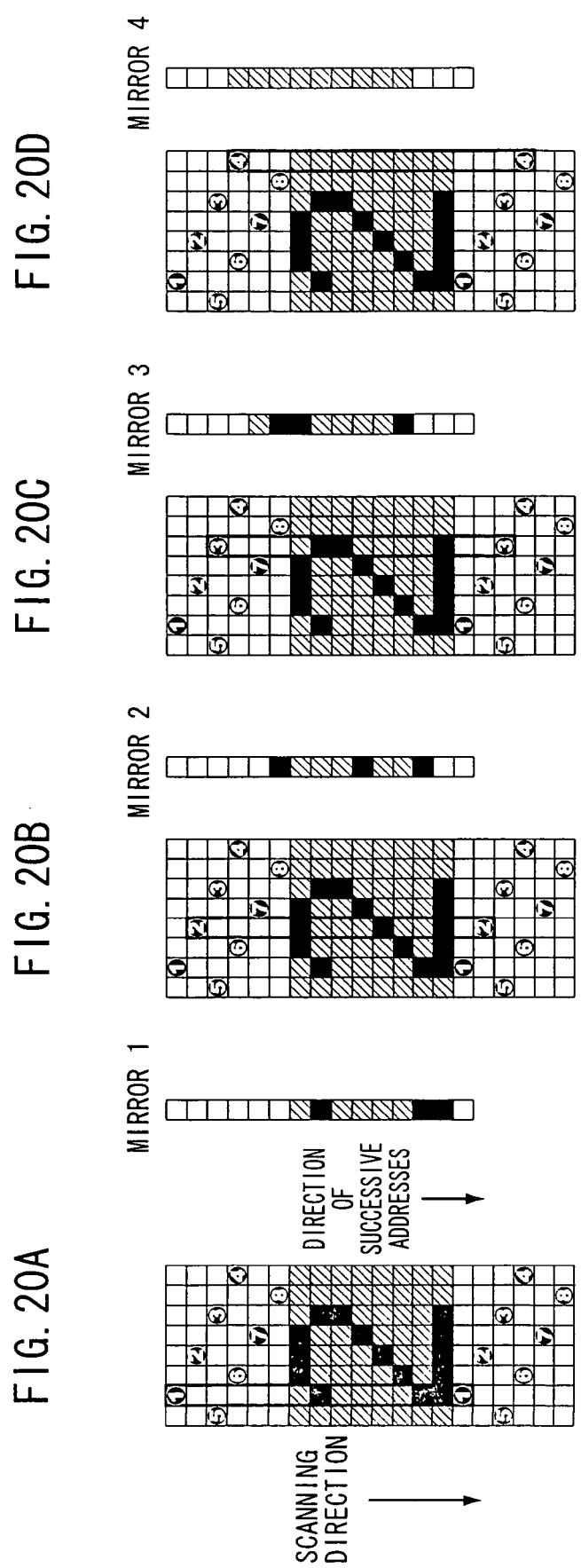

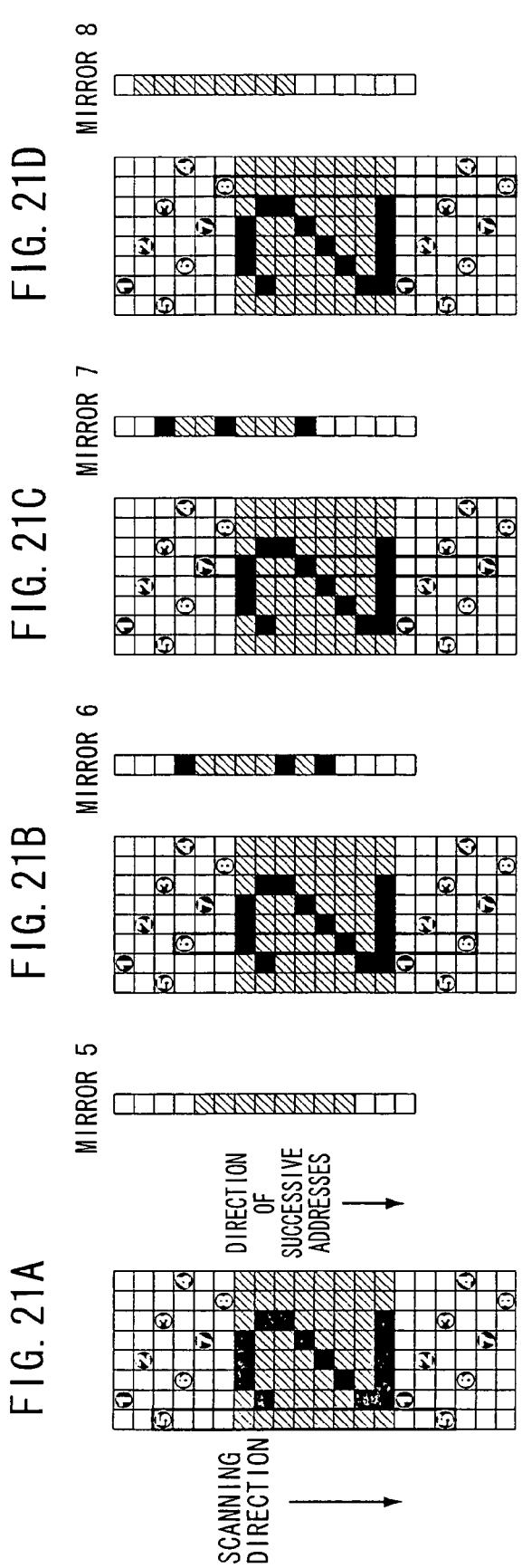

FRAME DATA PRODUCING APPARATUS, METHOD AND PLOTTING APPARATUS

TECHNICAL FIELD

The present invention relates to a frame data producing apparatus for use in a recording (plotting) apparatus for forming an image (a two-dimensional pattern) on an image recording surface by relatively moving an image recording unit having a plurality of image recording dot forming elements for forming an image recording dot group of a plurality of image recording dots on the image recording surface, in a predetermined scanning direction over the image recording surface, and successively supplying frame data each for the image recording unit to the image recording unit as the image recording unit moves in the scanning direction to cause the image recording units to form the image recording dot group on the image recording surface on a chronological basis, a frame data producing method applicable to the image recording apparatus, and an image recording apparatus.

BACKGROUND ART

Heretofore, there have been various known image recording apparatus for recording a desired image represented by image data on an image recording surface.

For example, various exposure apparatus incorporating a spatial light modulator comprising a digital micromirror device (DMD) or the like for modulating a light beam based on the image data have been proposed.

A DMD comprises a memory array (SRAM array) disposed on a semiconductor substrate of silicon or the like and micromirrors disposed two-dimensionally on the memory array. The micromirrors are tilted by controlling electrostatic forces of charges that are accumulated in the memory array, changing the angles of the reflecting surfaces of the micromirrors for thereby forming image recording dots at desired positions on an image recording surface to form an image thereon.

There has been proposed an exposure apparatus which employs a DMD for forming a desired image on an exposure surface by relatively moving the DMD in a predetermined scanning direction with respect to the exposure surface, inputting frame data made up of a plurality of image recording dot forming element data corresponding to a micromirror group, to the memory array of the DMD depending on the movement of the DMD in the scanning direction, and forming a group of image recording dots corresponding to the micromirror groups of the DMD chronologically on the exposure surface (Patent Document 1).

There has also been proposed an exposure apparatus having a DMD inclined a certain angle with respect to the scanning direction to perform the above exposure for thereby increasing the resolution of an image that is formed on the exposure surface.

For performing the exposure using such an exposure apparatus, it is necessary to input frame data to the DMD depending on the relative movement of the DMD in the scanning direction. Therefore, it is necessary to generate a plurality of frame data corresponding to the position of the DMD with respect to the exposure surface prior to the exposure.

A conventional process of generating frame data to form a numeral "2" on an exposure surface as shown in FIGS. 16A through 16E, 17A through 17E, and 18A through 18E will be described below. In FIGS. 16A through 18E, outlined encircled numbers 1 through 8 schematically represent eight micromirrors that make up one DMD.

Frames 1 through 15 shown in the lower ends of FIGS. 16A through 18E schematically represent frame data that are input to the DMD when the DMD is present in the illustrated positions.

Heretofore, for example, image data made up of pixel data corresponding to the respective pixels shown in FIGS. 16A through 18E are temporarily stored in a memory such as a DRAM or the like, and then the pixel data corresponding to the micromirrors represented by the encircled numbers 1 through 8 of the DMD are successively read out from the memory at the respective positions of the DMD shown in FIGS. 16A through 18E, thereby generating frame data made up of image recording dot data.

In FIGS. 16A through 18E, the pixel data represented by blank squares and hatched squares indicate turn-off data "0" for the micromirrors of the DMD, and the pixel data represented by solid squares indicate turn-on data "1" for the micromirrors of the DMD. A range indicated by the hatched squares represents a substantial range of an image recorded on the image recording surface, and has pixel data represented by "0" which are the same as blank squares.

Patent Document 1: Japanese Laid-Open Patent Publication No. 2004-056100

DISCLOSURE OF THE INVENTION

As described above, frame data are generated by successively reading out the pixel data corresponding to the respective micromirrors represented by the encircled numbers 1 through 8. However, if successive addresses are assigned in a direction perpendicular to the scanning direction in FIGS. 16A through 18E and the readout from the memory is controlled to successively read out the data for the micromirrors in the direction of the successive addresses, then the addresses where the data corresponding to the micromirrors are stored are discretely located in the address space of the memory as viewed from a control means for controlling the memory. In terms of the controlling of the memory, the memory takes considerable time to access the addresses thus located and read the data from the addresses one by one, and it will take quite a long time to acquire all the frame data.

In order to solve the above problem, the present applicant has proposed a technology to be described below (the specification of Japanese Patent Application No. 2005-045111).

As shown in FIG. 19, image data made up of pixel data are stored in a memory at successive addresses that are arranged in a direction aligned with a scanning direction.

Then, preset trajectory data for forming image recording dots with respective micromirrors are referred to, and data for the respective micromirrors including offset information of positional information (hereinafter referred to as "micromirror-specific data") are read out from the image data stored in the memory, as shown in FIG. 19, according to a sequence shown in FIGS. 20A through 20D and FIGS. 21A through 21D. The read micromirror-specific data are stored in a frame data memory as shown in FIG. 22B.

At this time, as shown in FIG. 22B, the image data are stored as frame data serving as data for the DMD in the frame data memory such that the direction of the successive addresses of the frame data memory is aligned with the direction in which the same frame data (in other words, the data for the micromirrors of the same DMD) are stored.

Then, the frame data are successively read out from the frame data memory shown in FIG. 22B in the direction of the successive addresses thereof, and the data (image recording dot data) are supplied to the micromirrors represented by the encircled numbers 1 through 8 of the DMD. As the DMD is moved relatively to the scanning direction over the exposure surface, an image (two-dimensional pattern) representing "2" that corresponds to the image data shown in FIG. 19 is formed on the exposure surface.

For an easier understanding, FIG. 22A shows data in the form of a group of micromirror-specific data, i.e., micromirror-specific data group data which are usually temporarily stored in the memory.

As described above with reference to FIGS. 20A through 21D, the micromirror-specific data can quickly be read out from the image data stored in the memory because the micromirror-specific data are read out in the direction of the successive addresses. The image recording dot data of the micromirror-specific data thus read out, i.e., the image recording dot data of the micromirror-specific data making up the micromirror-specific data group data shown in FIG. 22A, are stored in the frame data memory at changed locations by a process called a transposition process. However, since the addresses are not successive, it takes a long time to carry out the transposition process by way of software implementation.

The time-consuming transposition process poses a limitation on the speed at which the DMD moves in the scanning direction in the above exposure apparatus in which the DMD is relatively moved in the predetermined scanning direction with respect to the exposure surface, the frame data made up of a plurality of micromirror-specific data corresponding to the micromirror group are input to the memory array of the DMD depending on the movement of the DMD in the scanning direction, and the group of image recording dots corresponding to the micromirror groups of the DMD is formed chronologically on the exposure surface to form a desired image on the exposure surface.

If high-speed image recording services are required particularly to meet mass production demands or the like, then the transposition process for changing the locations of the image recording dot data of the plurality of the micromirror-specific data, i.e., the micromirror-specific data group data, to those of the frame data is hardware-implemented. However, hardware implementation is more costly than software implementation.

The present invention has been made in view of the above drawbacks. It is an object of the present invention to provide a frame data producing apparatus and method, and an image recording apparatus which are capable of quickly and simply performing a transposition process for transposing image recording dot forming element-specific data such as micromirror-specific data to frame data for an image recording unit.

It is another object of the present invention to provide a frame data producing apparatus and method, and an image recording apparatus which are capable of quickly and simply performing a transposition and decompression process for transposing recording dot forming element-specific data in the form of compressed data to frame data for an image recording unit while decompressing the compressed data.

According to the present invention, there is provided a frame data producing apparatus for use in an image recording apparatus for forming an image on an image recording surface by relatively moving image recording units each having a plurality of image recording dot forming elements for forming an image recording dot group of a plurality of image recording dots on the image recording surface, in a predetermined scanning direction over the image recording surface, and successively supplying frame data for each of the image recording units to the image recording unit as the image recording unit moves in the scanning direction to cause the image recording units to form the image recording dot group on the image recording surface on a chronological basis, the frame data producing apparatus comprising an image recording dot forming element-specific data generator for generating image recording dot forming element-specific data to be successively supplied to the respective image recording dot forming elements from image data corresponding to the image to be formed on the image recording surface, and a frame data generator for generating intermediate data including extracted data change points of the image recording dot forming element-specific data and thereafter generating frame data by inverting the intermediate data with respect to the data change points of the intermediate data.

According to the present invention, there is also provided a frame data producing method applicable to an image recording apparatus for forming an image on an image recording surface by relatively moving image recording units each having a plurality of image recording dot forming elements for forming an image recording dot group of a plurality of image recording dots on the image recording surface, in a predetermined scanning direction over the image recording surface, and successively supplying frame data for each of the image recording units to the image recording unit as the image recording unit moves in the scanning direction to cause the image recording units to form the image recording dot group on the image recording surface on a chronological basis, the frame data producing method comprising an image recording dot forming element-specific data generating step of generating image recording dot forming element-specific data to be successively supplied to the respective image recording dot forming elements from image data corresponding to the image to be formed on the image recording surface, and a frame data generating step of generating intermediate data including extracted data change points of the image recording dot forming element-specific data and thereafter generating frame data by inverting the intermediate data with respect to the data change points of the intermediate data.

According to the present invention, image recording dot forming element-specific data to be successively supplied to the respective image recording dot forming elements are generated from image data corresponding to the image to be formed on the image recording surface by the image recording units each having the image recording dot forming elements, intermediate data including extracted data change points of the generated image recording dot forming element-specific data are generated, and the generated image recording dot forming element-specific data are transposed to frame data for each of the image recording units by inverting the data with respect to the data change points of the generated intermediate data. Therefore, the transposition process can be performed quickly and simply.

If the image recording dot forming element-specific data comprise compressed data, then the storage capacity of a storage means for storing the image recording dot forming element-specific data may be small. The process of transposing and decompressing the compressed data can be performed quickly by extracting the data change points of the compressed data to generate the intermediate data and inverting the data with respect to the data change points of the generated intermediate data.

The compressed data may comprise run-length compressed data, accumulated data thereof, or the like. The compressed data should preferably be lossless compressed data.

For inverting the data with respect to the data change points of the intermediate data to generate the frame data, if the frame data for each of the image recording units to be supplied to the image recording units at a certain time point is represented by Fn and frame data to be supplied to each of the image recording units at a time point preceding the certain time point is represented by Fn−1, then the frame data Fn may be determined according to the expression Fn←Fn−1 XOR Fn where n=2, 3, . . . . The transposition process which employs XORing (exclusive-ORing) can be appropriately performed by way of software implementation.

An image recording apparatus incorporating the frame data producing apparatus and an image recording apparatus to which the frame data producing method is applied are also covered by the present invention as they solve the above problems.

The image recording units include DMDs, ink jet recording heads, or the like.

Inasmuch as the image recording units are not limited to spatial light modulators comprising DMDs or the like, but are also applicable to image recording apparatus having ink jet recording heads, the present invention is generally applicable to a frame data producing apparatus for use in an image recording apparatus for forming an image (a two-dimensional pattern) on an image recording surface by relatively moving image recording units each having a plurality of image recording dot forming elements for forming an image recording dot group of a plurality of image recording dots on the image recording surface, in a predetermined scanning direction over the image recording surface, and successively supplying frame data each for the image recording unit to the image recording unit as the image recording unit moves in the scanning direction to cause the image recording units to form the image recording dot group on the image recording surface on a chronological basis, a frame data producing method applicable to the image recording apparatus, and an image recording apparatus.

According to the present invention, the transposition process for generating frame data for each of the image recording units from the image recording dot forming element-specific data can be performed quickly and simply.

If the image recording dot forming element-specific data comprise compressed data, then the image recording dot forming element-specific data may be decompressed when they are transposed to the frame data for each of the image recording units. As a result, the transposition and decompression process can be performed quickly and simply.

BRIEF DESCRIPTION OF THE DRAWINGS

FIG. 8 is a schematic diagram showing the positional relationship between three DMDs and image data;

FIG. 9 is a configuration view of compressed data of the image data shown in FIG. 8;

FIGS. 16A through 16E are diagrams illustrative of a conventional method of generating frame data;

FIGS. 17A through 17E are diagrams illustrative of the conventional method of generating frame data;

FIGS. 20A through 20D are diagrams illustrative of a novel method of generating frame data;

FIGS. 21A through 21D are diagrams illustrative of the novel method of generating frame data;

BEST MODE FOR CARRYING OUT THE INVENTION

An image recording apparatus, a frame data producing apparatus for use in the image recording apparatus, and a frame data producing method applicable to the image recording apparatus according to the present invention will be described below with reference to the drawings in respect of an exposure recording system to which an embodiment of the apparatus and the method is applied.

Figure 1:
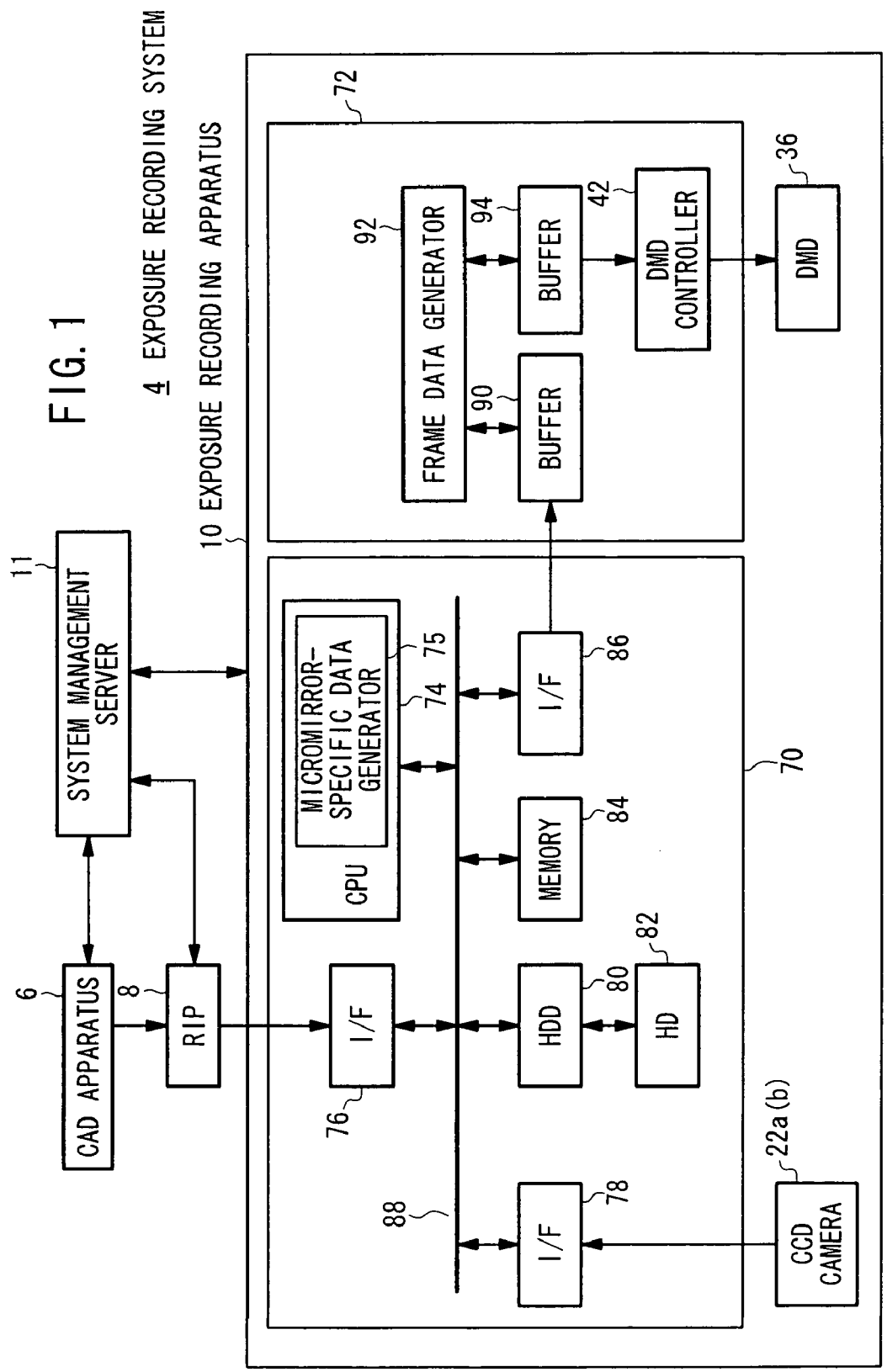
FIG. 1 is a block diagram of an exposure recording system according to an embodiment of the present invention.

FIG. 1 shows an arrangement of an exposure recording system 4 according to an embodiment of the present invention.

The exposure recording system 4 basically comprises a CAD apparatus (CAD server) 6 for generating image data and outputting the image data as vector data, a raster image processor (RIP) 8 for converting the vector data sent from the CAD apparatus 6 into bitmap data as raster image data, run-length encoding the bitmap data, and outputting the run-length data (compressed data) as image data, an exposure recording apparatus 10 for converting the image data sent from the RIP 8 into frame data, and recording (forming) an image on an image recording surface of a board (recording medium) by way of exposure based on the frame data, and a system management server 11 for managing and controlling the CAD apparatus 6, the RIP 8, and the exposure recording apparatus 10.

Figure 2:
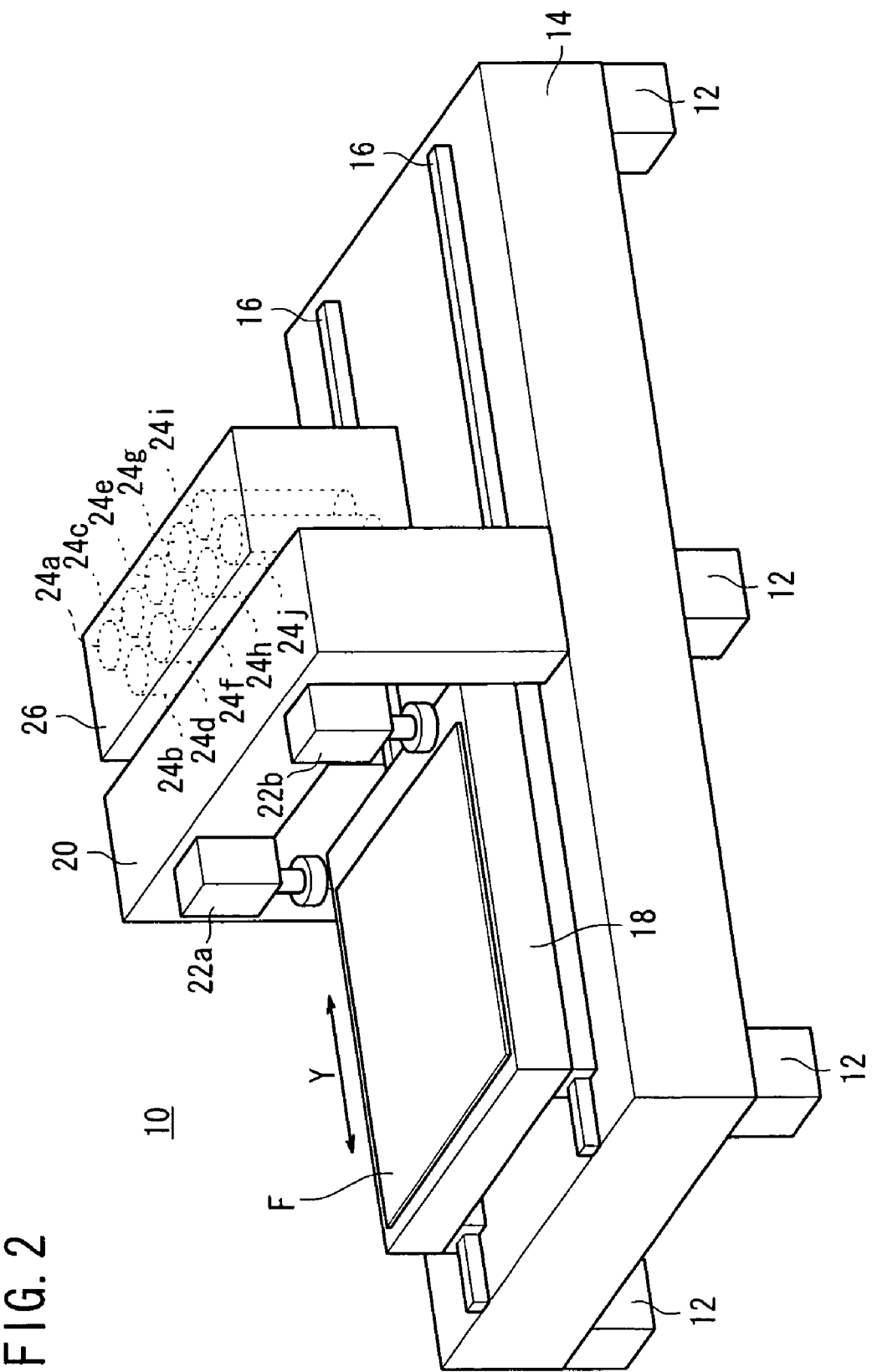
FIG. 2 is a structural view of the exposure recording apparatus according to the embodiment.

The exposure recording apparatus 10 is an apparatus for exposing a laminated printed wiring board or the like to light based on bitmap data. The exposure recording apparatus 10 is constructed as shown in FIG. 2.

The exposure recording apparatus 10 has a bed 14, which is essentially free of deformations, supported by a plurality of legs 12, and an exposure stage 18 mounted on the bed 14 by two guide rails 16 for reciprocating movement in the directions indicated by the arrow Y. An elongate rectangular board F coated with a photosensitive material is attracted to and held on the exposure stage 18. The coated surface of the board F serves as an image recording surface.

A portal column 20 is mounted centrally on the bed 14 over the guide rails 16. CCD cameras 22a, 22b are fixed to one side of the column 20 for detecting leading and trailing ends of the board F. A scanner 26 having a plurality of exposure heads 24a through 24j positioned and held therein for recording an image on the board F by way of exposure is fixed to the other side of the column 20.

The exposure heads 24a through 24j are arranged in two staggered rows, i.e., in a substantially matrix pattern, in a direction perpendicular to the directions indicated by the arrow Y in which the board F is movable.

Figure 3:
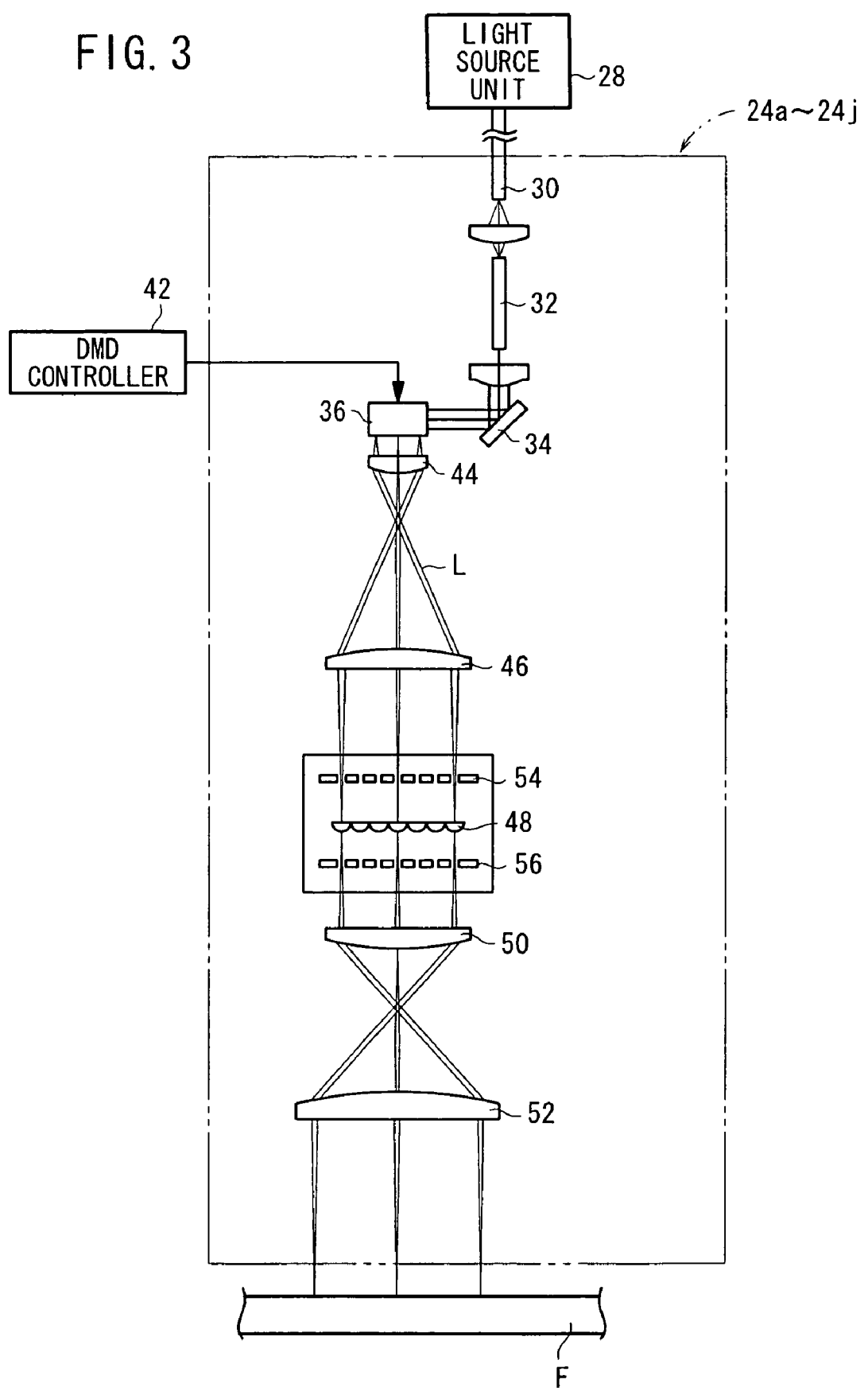
FIG. 3 is a schematic structural view of each of exposure heads of the exposure recording apparatus according to the embodiment.

FIG. 3 shows a structure of each of the exposure heads 24a through 24j. Each of the exposure heads 24a through 24j is supplied with a combined laser beam L emitted from a plurality of semiconductor laser devices of a light source unit 28 and introduced through an optical fiber 30. The exit end of the optical fiber 30 is followed successively by a rod lens 32, a reflecting mirror 34, and a digital micromirror device (DMD) 36 serving as an image recording unit (an image recording dot forming element group).

Figure 4:
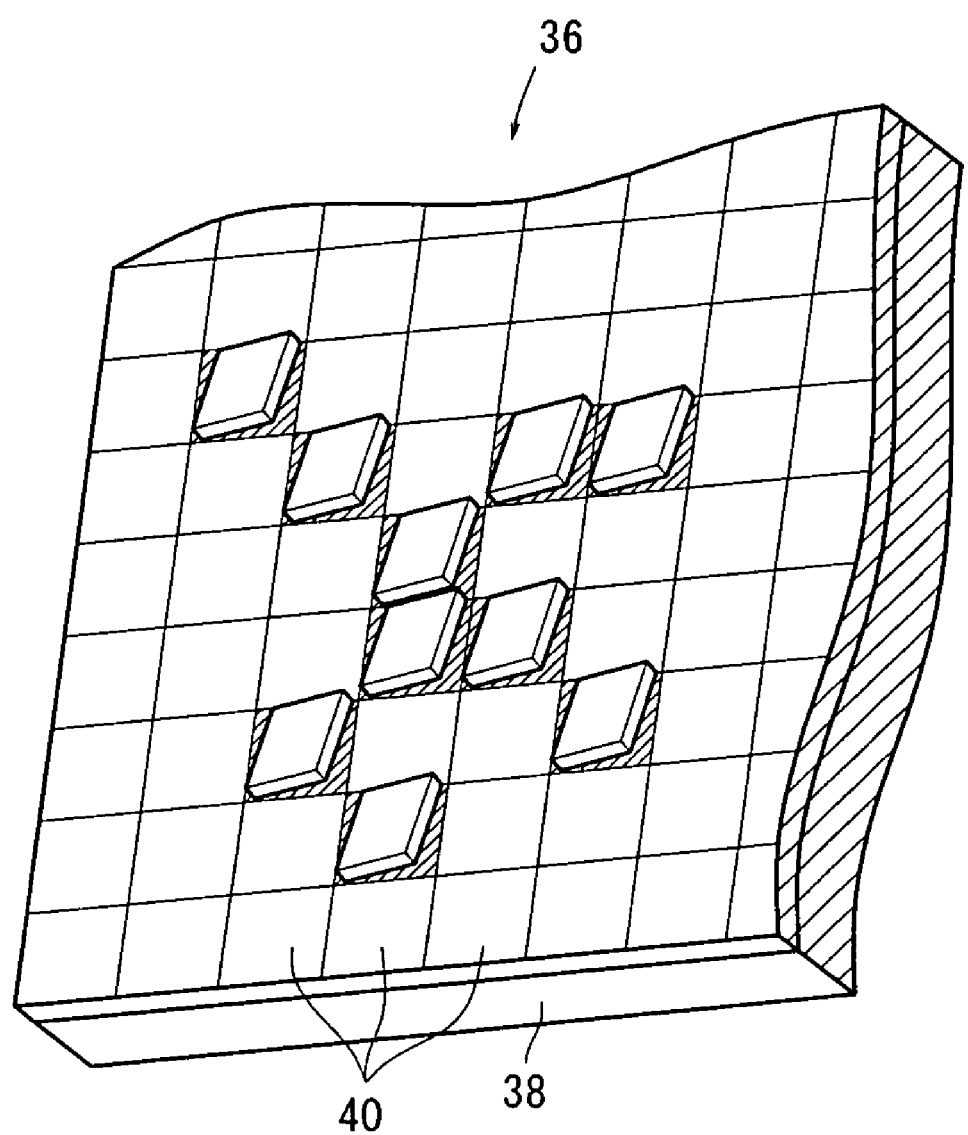
FIG. 4 is a view illustrative of a DMD of the exposure head according to the embodiment.

As shown in FIG. 4, the DMD 36 comprises a number of micromirrors 40 (image recording dot forming elements) swingably arrayed in a grid-like pattern on an SRAM array (memory array) 38. A material having a high reflectance such as aluminum or the like is evaporated on the surface of each of the micromirrors 40. When a digital signal according to frame data is written into the SRAM array 38 from a DMD controller 42, the micromirrors 40 are tilted in a given direction depending on the digital signal, turning on and off the laser beam L.

The laser beam L that is reflected by the DMD 36 with the controlled on/off state travels successively through first focusing optical lenses 44, 46 each provided as an magnifying optical system, a microlens array 48 comprising a number of lenses corresponding respectively to the micromirrors 40 of the DMD 36, and second focusing optical lenses 50, 52 each provided as a zoom optical system. The microlens array 48 is preceded and followed by respective microaperture arrays 54, 56 for removing stray light and adjusting the laser beam L to a desired beam spot diameter.

Figure 5:
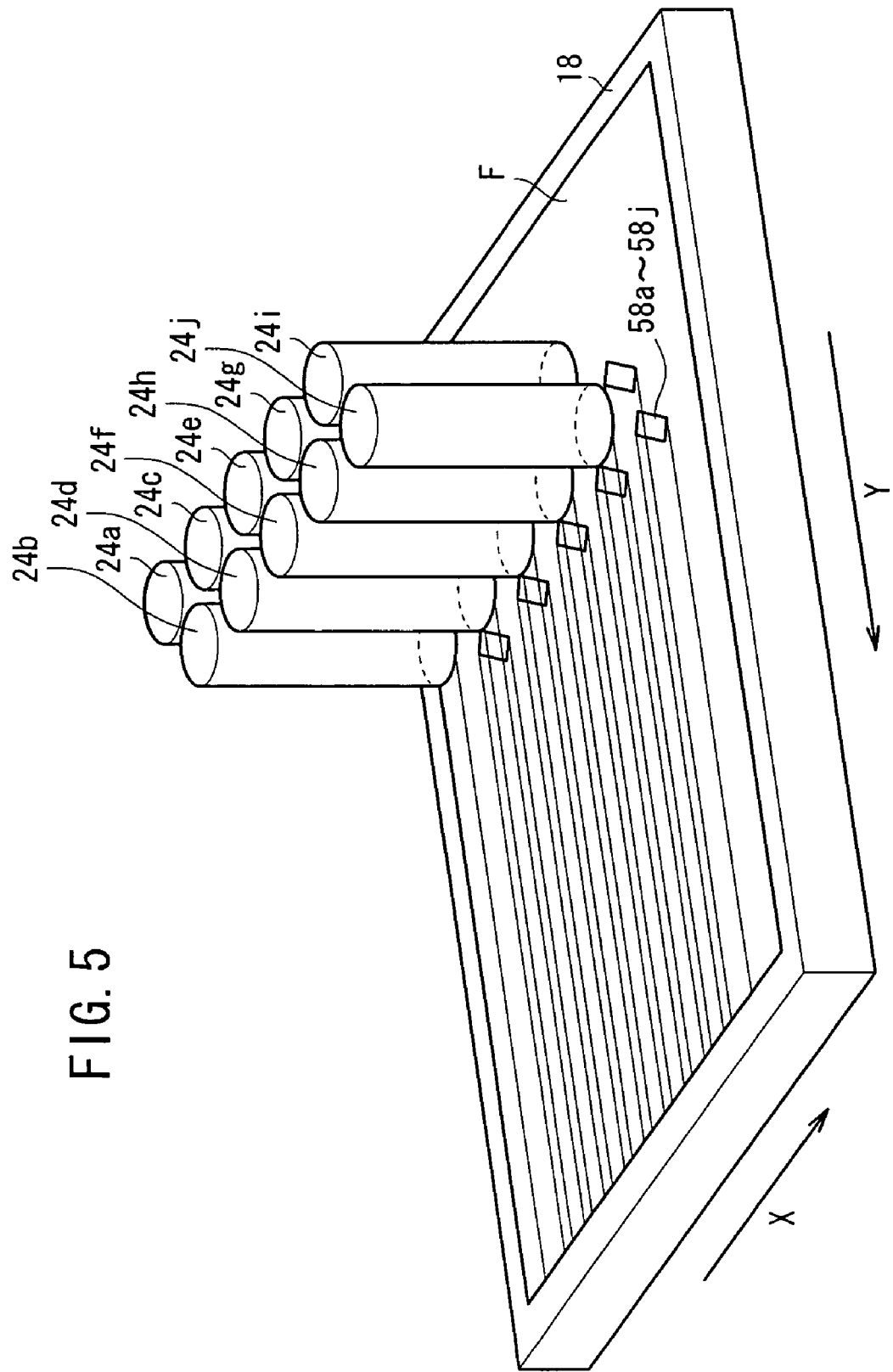
FIG. 5 is a view showing the relationship between the exposure heads and a board positioned on an exposure stage of the exposure recording apparatus according to the embodiment.
Figure 6:
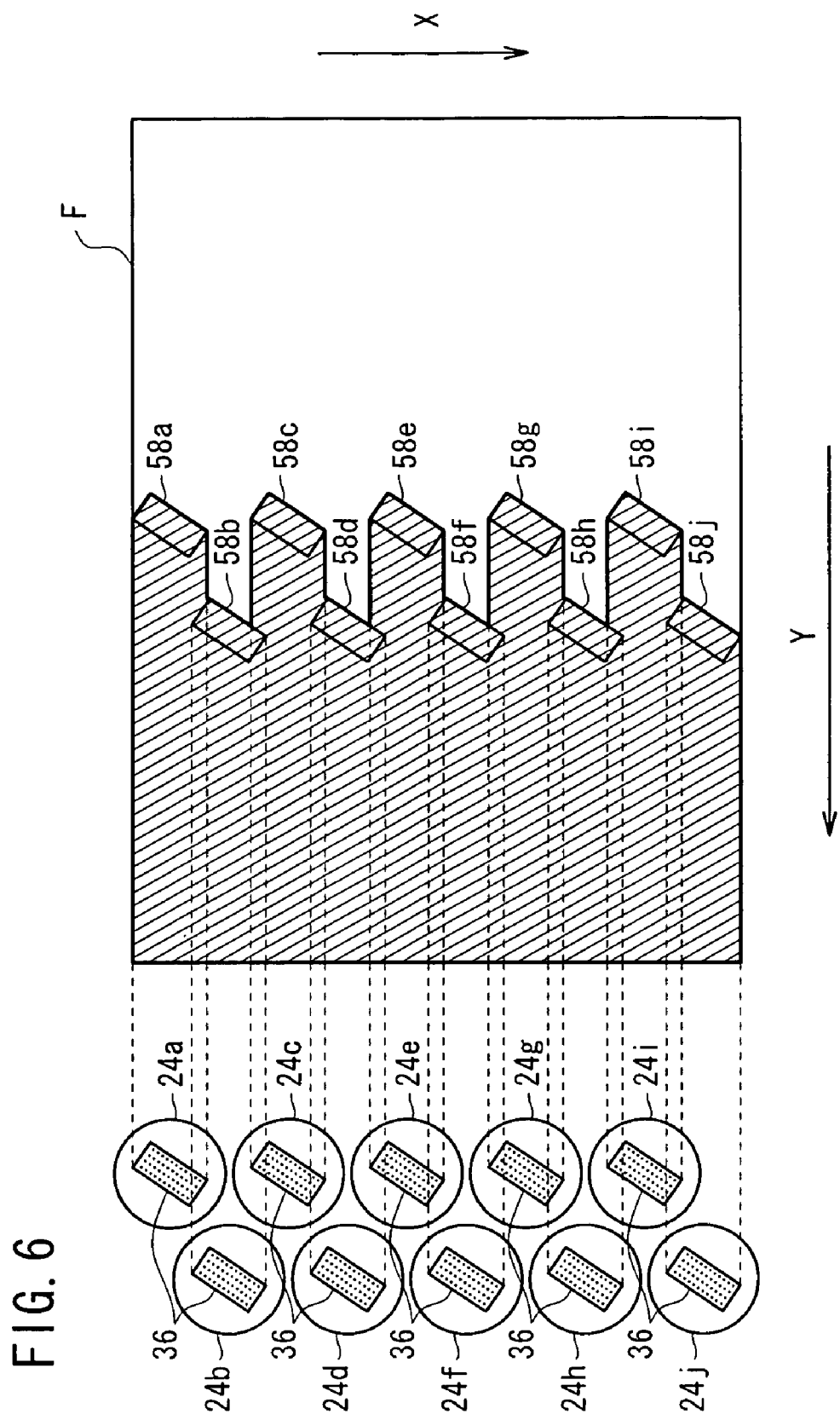
FIG. 6 is a view showing the relationship between the exposure heads and exposure areas on the board of the exposure recording apparatus according to the embodiment.

As shown in FIGS. 5 and 6, the DMDs 36 incorporated in the respective exposure heads 24a through 24j are inclined at a predetermined angle to the directions indicated by the arrow Y in which the board F is movable, for achieving a high resolution. Specifically, since the DMDs 36 are inclined to the directions in which the board F is movable, the spacing between the micromirrors 40 of the DMDs 36 in the direction indicated by the arrow X which are perpendicular to the direction indicated by the arrow Y is reduced, increasing the resolution of an image that is recorded in the direction indicated by the arrow X. The resolution in the direction indicated by the arrow Y can be adjusted by the speed at which the board F moves. Exposure areas 58a through 58j which are exposed at one time by the respective exposure heads 24a through 24j are arranged to overlap in the directions indicated by the arrow X so as to make the exposure heads 24a through 24j seamless.

As shown in FIG. 1, the exposure recording apparatus 10 has a control circuit including an image data processor 70 for converting image data supplied from the RIP 8 into micromirror-specific data (image recording dot forming element-specific data) while referring to preset image recording dot forming trajectory data for the micromirrors 40 with respect to the image recording surface of the board F, based on the leading and trailing ends of the board F whose images have been acquired by the CCD cameras 22a, 22b, and an exposure unit 72 for generating frame data from the micromirror-specific data supplied from the image data processor 70 and actuating the DMDs 36 to record an image on the board F by way of exposure.

The image data processor 70 comprises a personal computer, for example, having a CPU 74 which functions as a micromirror-specific data generator (image recording dot forming element data generator) 75. Connected to the CPU 74 through a bus 88 are an interface (I/F) 76 for receiving image data sent from the RIP 8, an interface (I/F) 78 for receiving alignment information data representing the leading and trailing ends of the board F which has been acquired by the CCD cameras 22a, 22b, a hard disk (HD) 82 for storing the received image data, the acquired alignment information data, and the image recording dot forming trajectory data for the micromirrors 40 which have been received from the system management server 11 through an interface, not shown, through a hard disk drive (HDD) 80, a memory 84 serving as a main storage unit, and an interface (I/F) 86 for transmitting the micromirror-specified data generated by the micromirror-specific data generator 75 to the exposure unit 72.

The micromirror-specific data generator 75 generates the micromirror-specific data to be successively supplied to the respective micromirrors 40 from the image data which corresponds to an image to be formed on the image recording surface of the board F.

The exposure unit 72 comprises a buffer 90 serving as a memory for temporarily storing the micromirror-specific data sent from the I/F 86 of the image data processor 70, a frame data generator 92 for converting the micromirror-specific data stored in the buffer 90 into frame data according to the array of the micromirrors 40 of the DMD 36, a buffer 94 serving as a memory for temporarily storing the frame data, and a DMD controller 42 for controlling the micromirrors 40 of the DMD 36 to record an image on the board F by way of exposure, based on the frame date stored in the buffer 94.

The frame data generator 92 generates the frame data by generating intermediate data (also referred to as edge frame data) including data change points extracted from the micromirror-specific data stored in the buffer 90, and inverting the data with respect to the data change points of the intermediate data.

Figure 7:
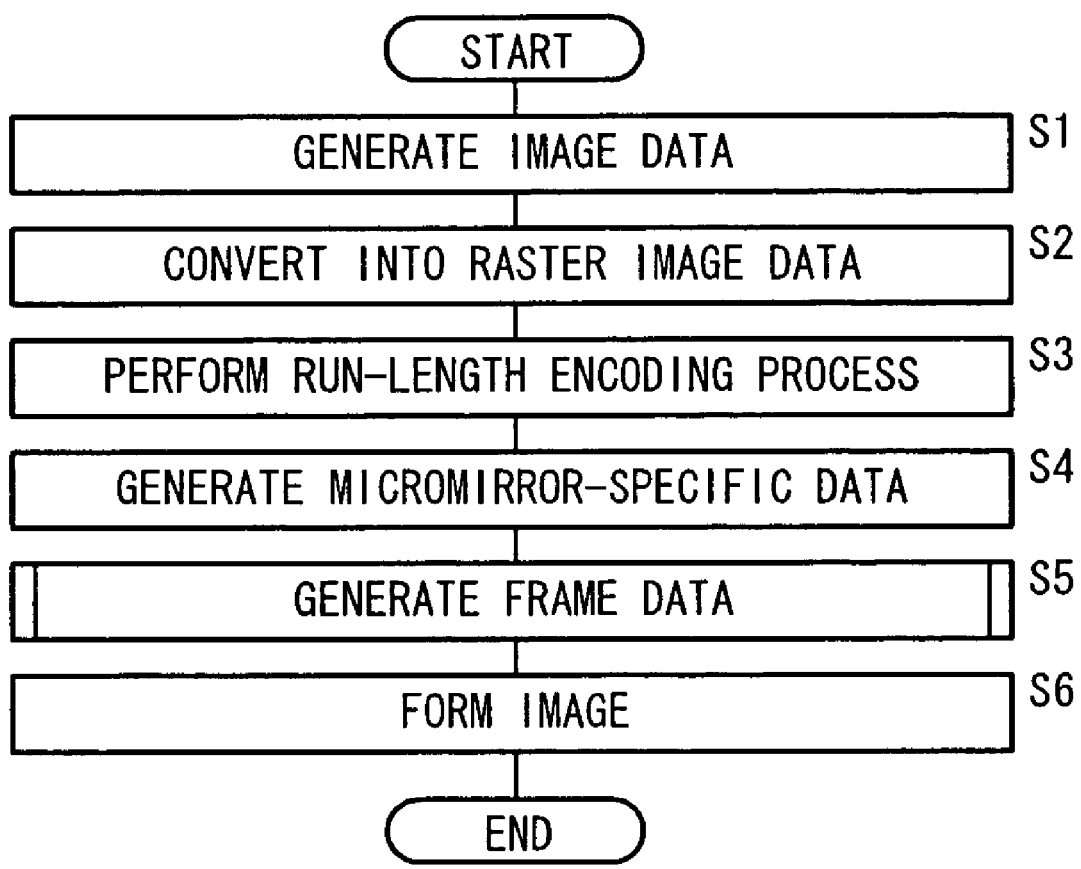
FIG. 7 is a flowchart of a processing sequence of a micromirror-specific data generator and a frame data generator of the exposure recording system according to the embodiment.

The exposure recording system 4 according to the embodiment is basically constructed as described above. Operation and advantages of the exposure recording system 4 will be described below with reference to FIG. 7.

In step S1, the CAD apparatus 6 generates image data corresponding to an image to be recorded on the board F by way of exposure.

The image data generated by the CAD apparatus 6 are sent in a vector data format to the RIP 8.

In step S2, the RIP 8 converts the vector data into image data 102 in a raster image data format shown in FIG. 8.

Then, the RIP 8 compresses the image data 102 by the run-length encoding, producing run-length compressed image data 104 shown in FIG. 9 (step S3).

As shown in FIG. 9, the image data 104 are represented, for each of the lines 1 through 8 of the image, by the number of successive pixels "0" of the image data 102 in the direction of the line and the number of successive pixels "1" of the image data 104 in the direction of the line. In regard to lines 1 and 2 of the image, in the image data 102 shown in FIG. 8, for example, since the line 1 has 16 successive pixels "0" in the direction of the line, the run-length image data 104 of the line 1 are represented by "16", and since the line 2 has 2 successive pixels "0", 4 successive pixels "1", 4 successive pixels "0", 4 successive pixels "1", and 2 successive pixels "0" in the direction of the line, the run-length image data 104 of the line 2 are represented by "2, 4, 4, 4, 2". The run-length image data 104 "2, 4, 4, 4, 2" are equivalent to accumulated data "2, 6, 10, 14, 16" which are also compressed data.

The run-length image data 104 generated by the RIP 8 are sent from the RIP 8 to the image data processor 70, the I/F 76, the bus 88, and the HDD 80 of the exposure recording apparatus 10 and stored in the HD 82.

Then, the micromirror-specific data generator 75 of the image data processor 70 generates micromirror-specific data to be successively supplied to the respective micromirrors 40 from the image data 104 corresponding to an image to be formed on the image recording surface of the board F and the image recording dot forming trajectory data for the micromirrors 40. Actually, the image data 104 comprise compressed data in the run-length format. However, micromirror-specific data can be generated from other than compressed data.

Figure 10:
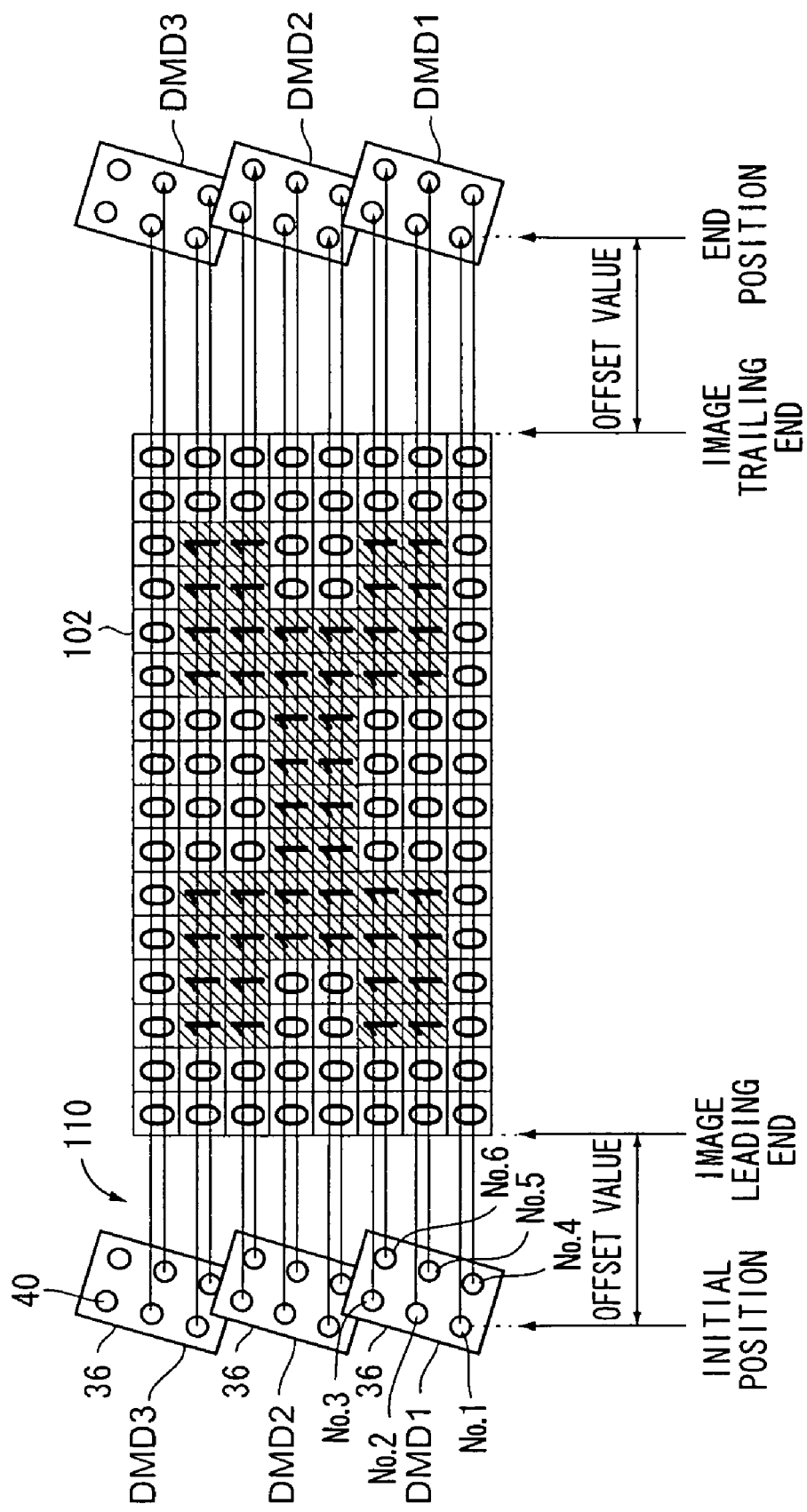
FIG. 10 is a schematic view illustrative of image recording dot forming trajectory data.

For an easier understanding, FIG. 10 schematically illustrates image recording dot forming trajectory data 110 representing the scanning trajectories of light beams applied from the respective micromirrors 40 to the board F on the assumption that there are three DMDs 1 through 3, rather than the ten DMDs 36 corresponding to the exposure heads 24*a* through 24*j*, and each of the three DMDs 1 through 3 comprises six micromirrors 40 numbered respectively by Nos. 1 through 6.

It can thus be seen that the No. 1 micromirror 40 and the No. 4 micromirror 40 of the DMD 1, for example, follow the image recording dot forming trajectory data 110 on the same line 1 (see also FIG. 8) in the scanning direction, and the No. 2 micromirror 40 and the No. 5 micromirror 40 of the DMD 1 follow the image recording dot forming trajectory data 110 on the same line 2 (see also FIG. 8).

The image recording dot forming trajectory data 110 include an offset value (offset information) produced by dividing the distance from an initial position of each micromirror 40 (each beam) to an image leading end by the resolution, and an offset value produced by dividing the distance from an image trailing end to an end position of each micromirror 40 by the resolution.

The image recording dot forming trajectory data 110 shown in FIG. 10 extend parallel to the direction of the lines of the image. Actually, since the board F, etc. may possibly be deformed, the image recording dot forming trajectory data 110 may be corrected based on the image information acquired from the CCD cameras 22*a*, 22*b*, for example.

Figure 11:
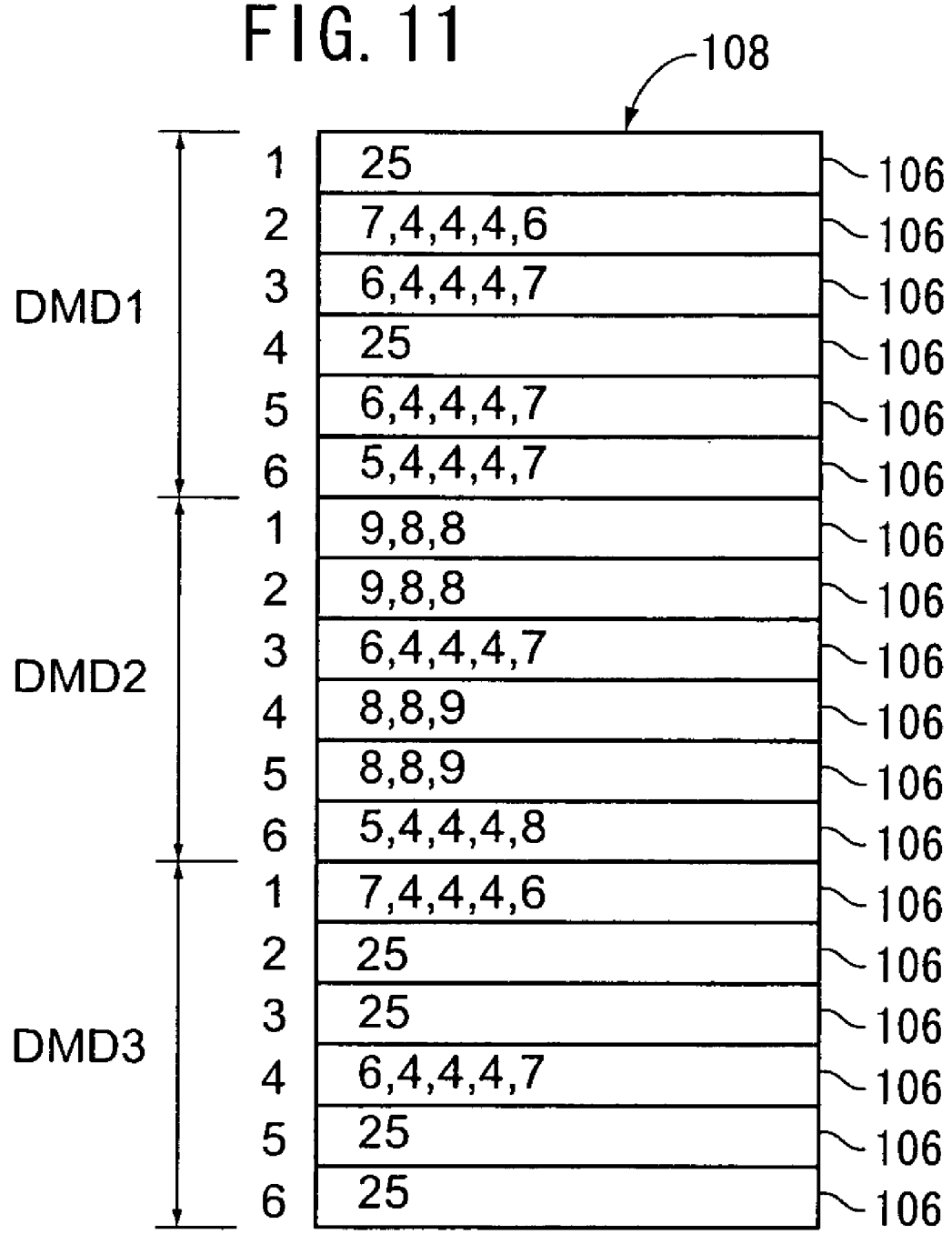
FIG. 11 is a configuration view of micromirror-specific data group data.

FIG. 11 shows group data 108 of micromirror-specific data 106 (micromirror-specific data group data) generated based on the image recording dot forming trajectory data 110 shown in FIG. 10 and the image data 104 (compressed data) or the image data 102. For example, the micromirror-specific data 106 for the No. 2 micromirror 40 of the DMD 1 are made up of 7 "0"s including an offset value of "5" from the initial position to the image leading end (image recording data of "0" as there is no exposure involved) and 2 "0"s because first 2 image recording data for the line 2 of the image data 102 are turn-off data, 4 "1"s, 4 "0"s, 4 "1"s, and 6 "0"s including 2 "0"s and an offset value of "4" from the image trailing end to the end position. Therefore, the micromirror-specific data 106 for the No. 2 micromirror 40 of the DMD 1 are represented by 7 "0"s, 4 "1"s, 4 "0"s, 4 "1"s, and 6 "0"s.

The micromirror-specific data group data 108 (see FIG. 11) made up of the micromirror-specific data 106 thus generated are sent from the memory 84 of the image data processor 70 via the I/F 86 to the buffer 90 of the exposure unit 72 where they are stored.

In step S5, the frame data generator 92 generates intermediate data including extracted data change points of the micromirror-specific data 106 making up of the micromirror-specific data group data 108 stored in the buffer 90, and thereafter generates the frame data by inverting the data at each of the data change points in the intermediate data.

Figure 12:
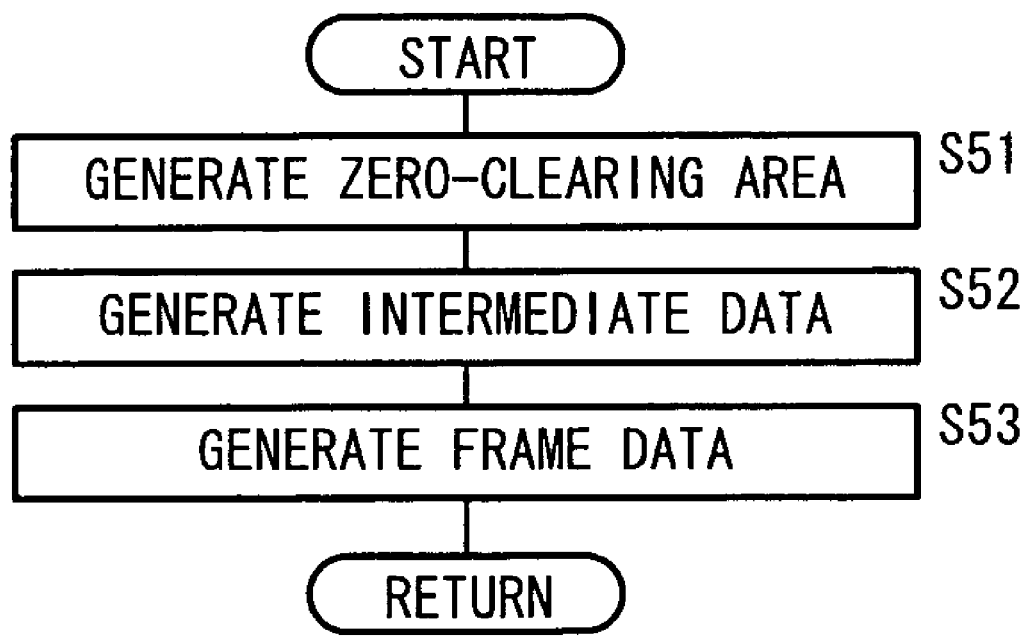
FIG. 12 is a flowchart of a processing sequence of the frame data generator of the exposure recording system according to the embodiment.

FIG. 12 is a flowchart of a frame data generating process carried out by the frame data generator 92. The frame data generating process is performed using exclusive-ORing (XOR) operation.

Figure 13:
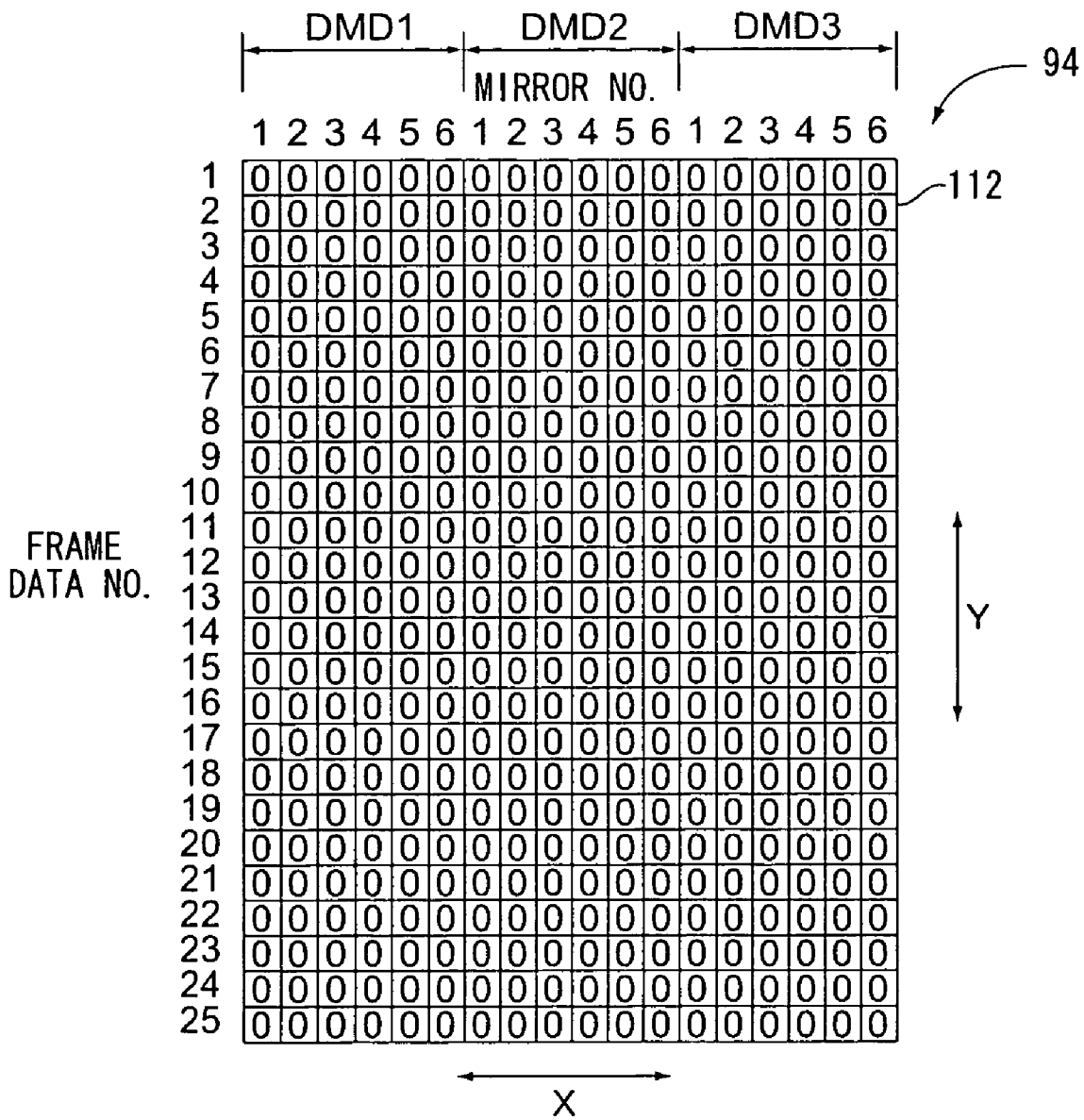
FIG. 13 is a diagram illustrative of a given area of frame data which is cleared to zero by way of initialization.

In step S51, the frame data generator 92 generates zero data 112 by clearing a memory area storing the frame data in the buffer 94 to zero for initialization, as shown in FIG. 13. That is, zero is written into each memory cell per one bit.

As can be understood by referring to the micromirror-specific data group data 108 shown in FIG. 11, the memory capacity of the memory area storing the zero data 112 in the buffer 94 is as large as 450 bits in view of a total of 450 (25×18) image recording dots that are based on 25 image recording dots in the directions indicated by the arrow Y that are the directions in which the exposure heads 24*a* through 24*j* (the description here is limited to the DMDs 1 through 3 housed in the three exposure heads) are relatively movable (the directions in which the board F is movable), and 18 image recording dots corresponding to the number of micromirrors 40 in the directions indicated by the arrow X which are perpendicular to the directions indicated by the arrow Y.

Figure 14:
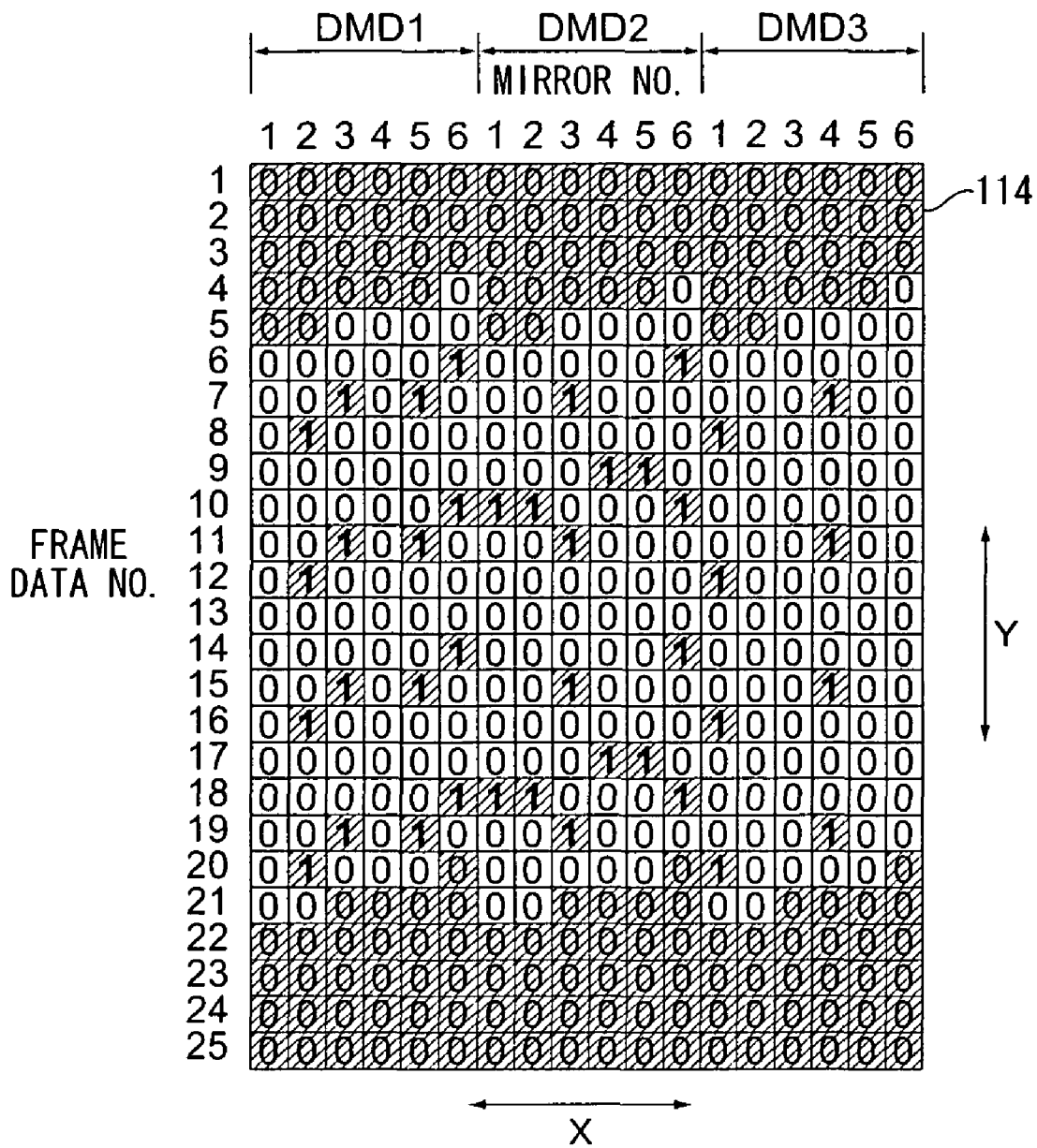
FIG. 14 is a configuration view of intermediate data in which data change points of micromirror-specific data are extracted and flagged.

Then, the frame data generator 92 refers to micromirror-specific data group data 108 shown in FIG. 11 which are stored in the buffer 90, extracts data change points of the respective micromirror-specific data 106, and generates intermediate data 114 with flags="1" set on rows of memory cells in the memory area of the frame data of the zero data 112 which correspond to the data change points, as shown in FIG. 14.

For example, the extraction of data change points and the generation of intermediate data 114 with respect to the No. 2 micromirror 40 of the DMD 1 will be described below. Since the micromirror-specific data 106 are represented by "7, 4, 4, 4, 6", the first 7 memory cells (image recording dots) of frame data Nos. 1 through 7 including five offset image recording dots are of "0". When frame data No. 7 changes to frame data No. 8, the run-length data changes from "7" to "4". Therefore, the flag="1" is set on the memory cell (image recording dot) of frame data No. 8. When frame data No. 11 (11=7+4) changes to frame data No. 12, the run-length data changes from "4" to "4", the flag="1" is set on the memory cell (image recording dot) of frame data No. 12. The flags are similarly set on the remaining memory cells. The intermediate data 114 may be considered to be edge data (edge extraction data).

Figure 15A:
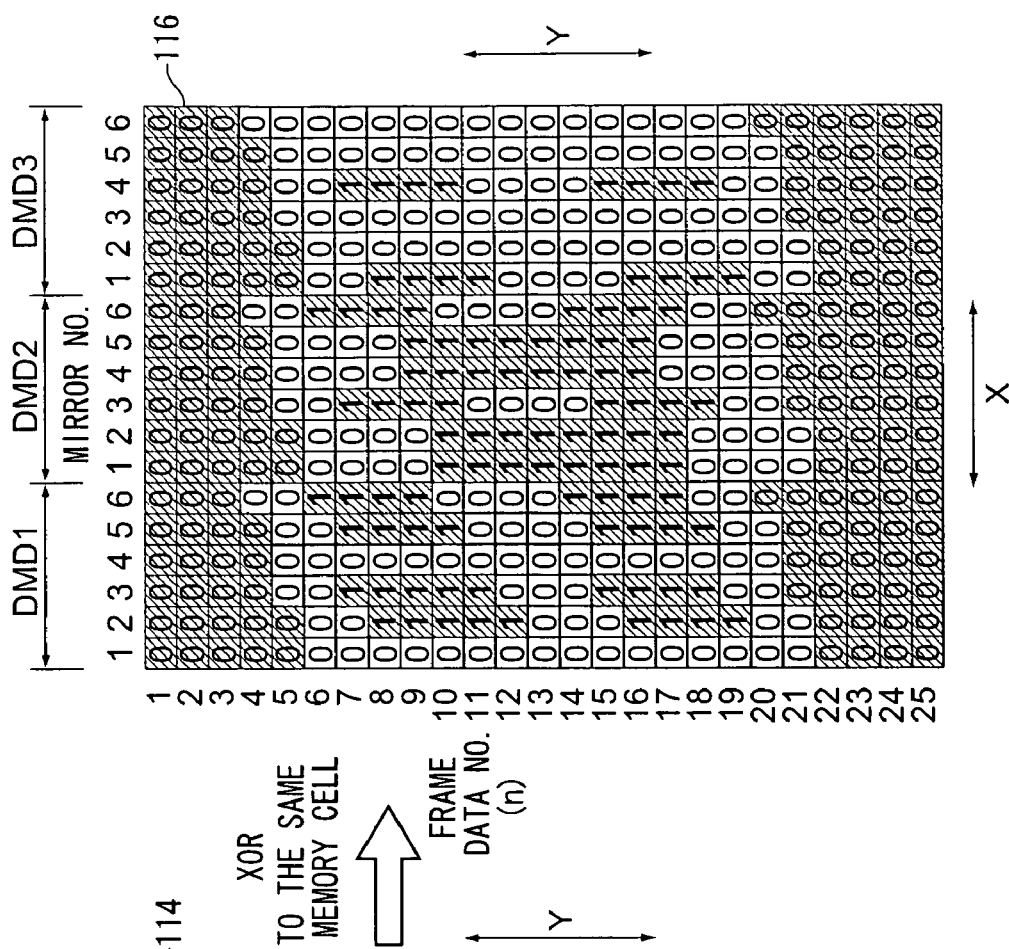
FIG. 15A is a configuration view of the intermediate data.
Figure 15B:
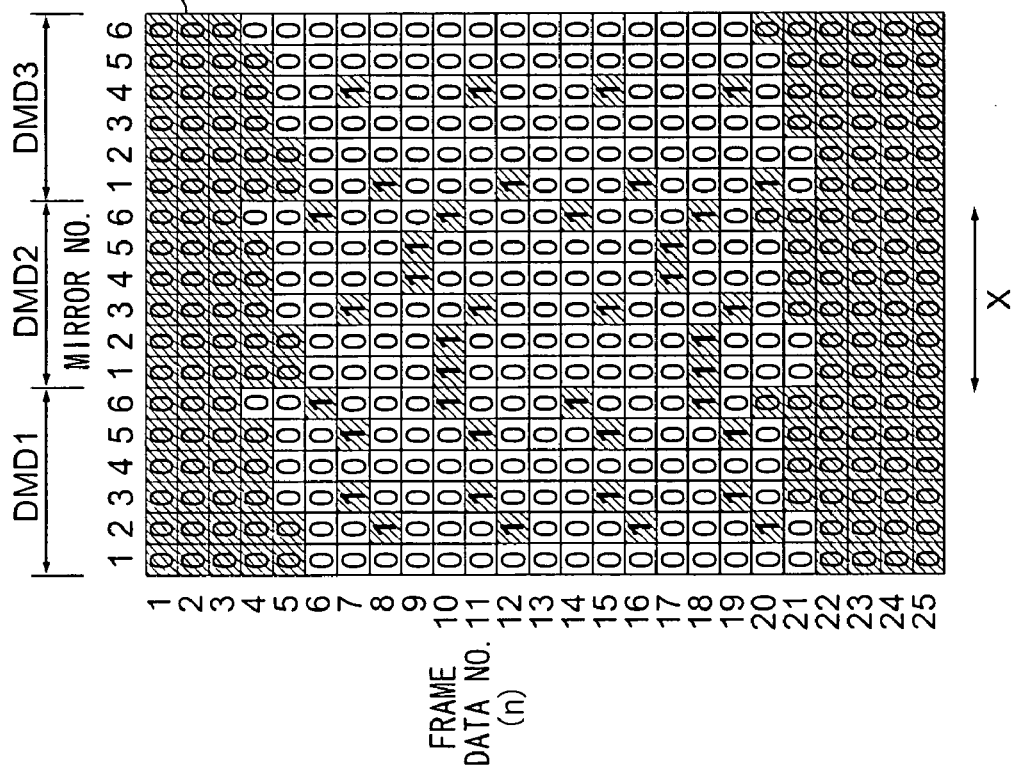
FIG. 15B is a configuration view of the frame data.
Figure 18E:
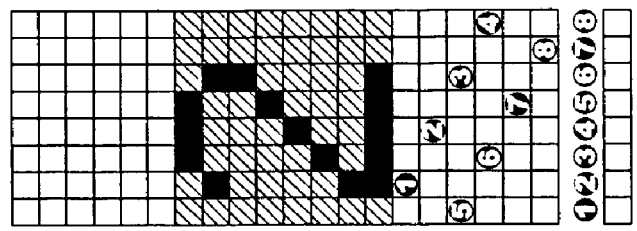
FIGS. 18A through 18E are diagrams illustrative of the conventional method of generating frame data.
Figure 18D:
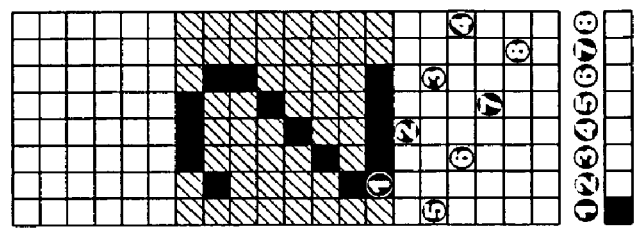
Figure 18C:
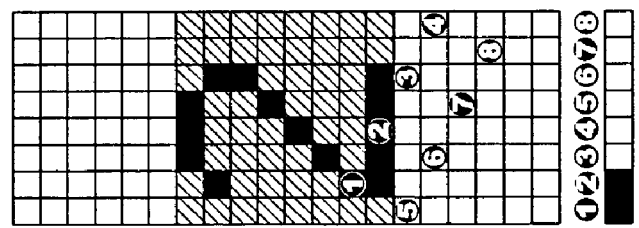
Figure 18B:
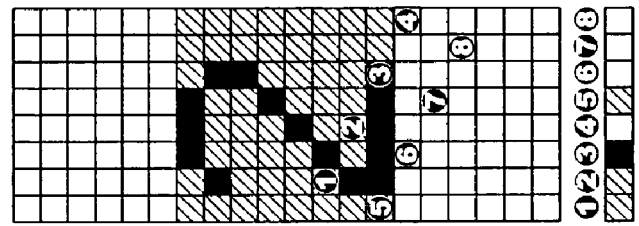
Figure 18A:
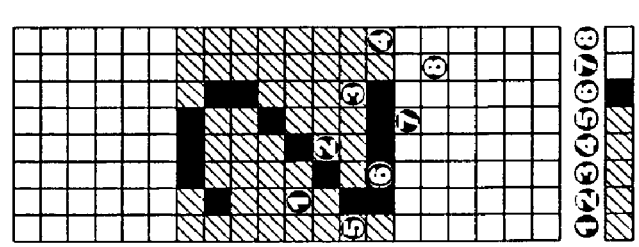
Figure 19:
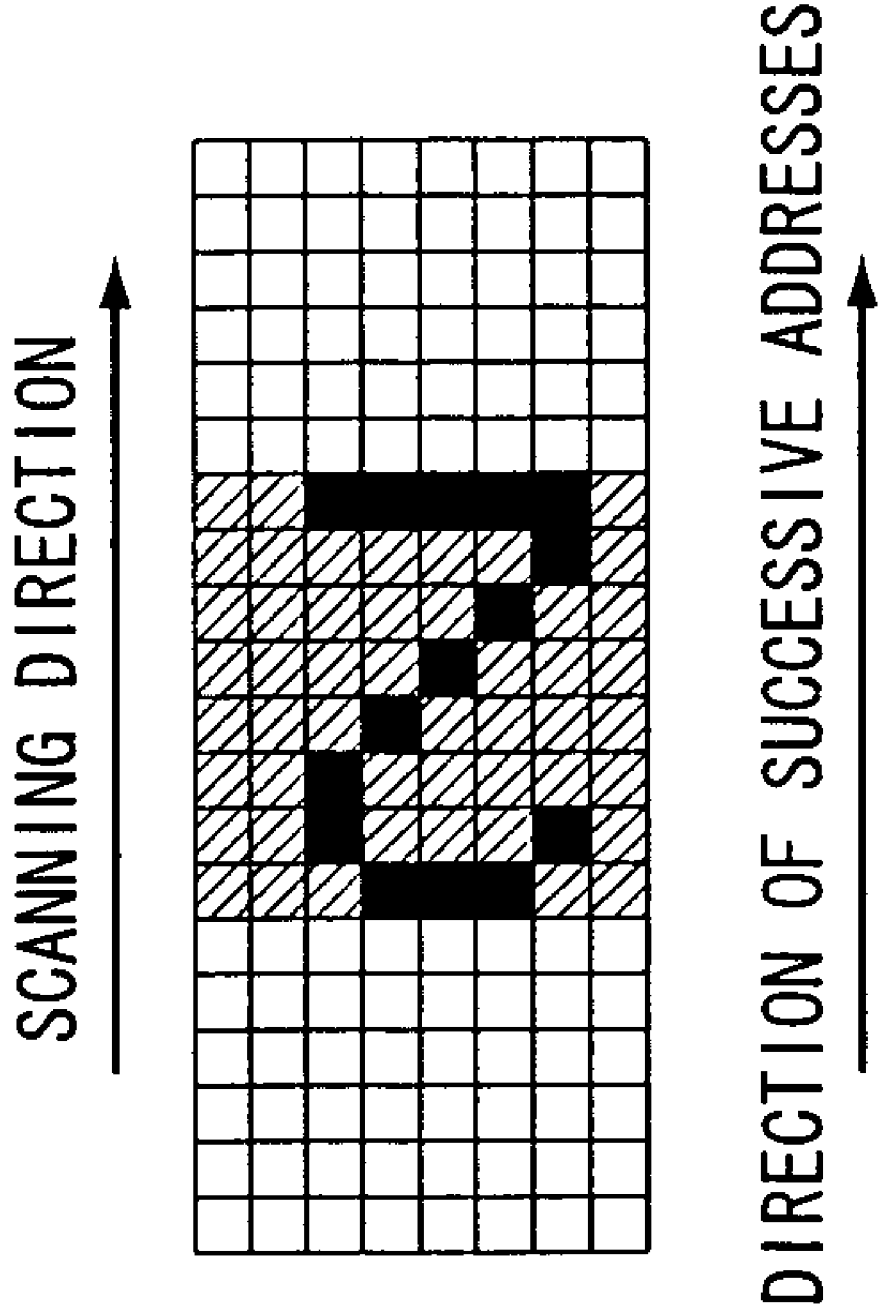
FIG. 19 is a diagram illustrative of a memory storing therein image data made up of pixel data such that a direction of successive addresses and a scanning direction are aligned with each other.
Figure 22B:
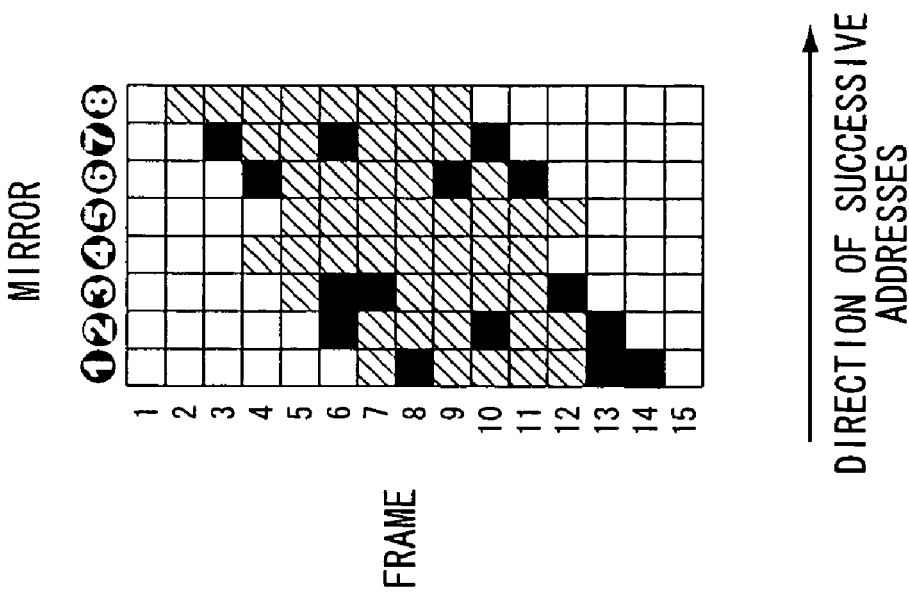
FIG. 22B is a diagram illustrative of frame data stored in a memory.
Figure 22A:
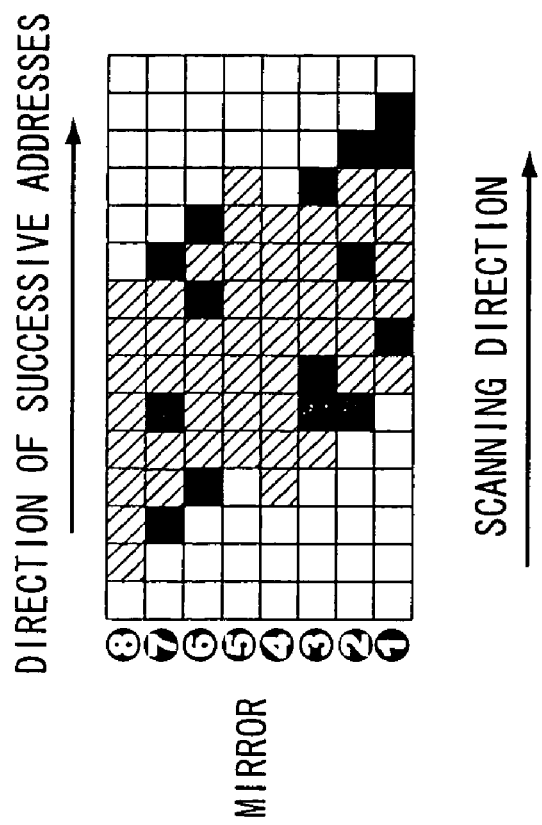
FIG. 22A is a diagram illustrative of micromirror-specific data group data which are data temporarily stored in a memory.

In step S53, frame data 116 shown in FIG. 15B are generated by inverting the data of the intermediate data 114 shown in FIG. 14 with respect to each of the data change points on which the flag="1" is set, in the intermediate data 114 in the directions indicated by the arrow Y which correspond to the mirror numbers of the respective micromirrors 40. For example, a process of generating frame data from the intermediate data 114 with respect to the No. 2 micromirror 40 of the DMD 1 will be described below. Since the first 7 memory cells (image recording dots) up to frame data No. 7 are of "0" and the data change from "0" to "1" at frame data No. 8, the data up to a frame data number preceding frame data No. 12 which represents the next data change point are inverted from "0" to "1". Then, as frame data No. 12 represents a data change point in the intermediate data 114, the data up to a frame data number preceding frame data No. 16 which represents the next data change point are inverted from "0" to "1". The other data are similarly inverted.

Actually, the above frame data generating process is carried out by exclusive-ORing (XORing) vertically arranged data of the frame data. The XORed results are supplied to overwrite the original data, and the updated data are used for XORing. The process is repeated until n=2, 3 . . . , 25 to generate frame data 116 shown in FIG. 15B.

If frame data to be supplied to each of the three DMDs 1 through 3 which correspond to three image recording units at a certain time point is represented by Fn and frame data to be supplied to each of the three DMDs 1 through 3 at a time point preceding the certain time point is represented by Fn−1, then the frame data Fn is determined according to the following expression (1):

$$Fn \leftarrow Fn-1 \, XOR \, Fn \text{ where } n=2,3, \quad (1)$$

The frame data 116 shown in FIG. 15B can quickly be generated by XORing the intermediate data 114 shown in FIG. 15A (identical to FIG. 14) according to the above equation (1). Though a transposition process which employs the XORing depends on the performance and specifications of the CPU of the frame data generator 92, the transposition process can be quickly performed by way of software implementation as it is normally easy to XOR 32-bit data at a time.

When the frame data 116 are generated in the buffer 94 by the XORing, the image generating process in step S5 is carried out.

In the exposure recording apparatus 10, the exposure stage 18 is moved from the scanner 26 to the CCD cameras 22a, 22b. The DMD controller 42 supplies the frame data 116 stored in the buffer 94 to the DMDs 1 through 3, which record a desired image on the board F by way of exposure in step S5.

Referring back to FIGS. 2 and 3, the laser beam L emitted from the light source unit 28 is introduced through the optical fiber 30 into the exposure heads 24a through 24j. The introduced laser beam L travels through the rod lens 32 and is reflected by the reflecting mirror 34 and applied to the DMDs 36.

The DMD controller 42 reads the frame data from the buffer 94, and controls on and off of each of the micromirrors 40 of the DMDs 36 according to the "0"s and "1" of the frame data. The laser beam L which is selectively reflected by the micromirrors 40 in a desired direction is magnified by the first focusing optical lenses 44, 46, and then is adjusted to a desired beam spot diameter by the microaperture array 54, the microlens array 48, and the microaperture array 56. Thereafter, the laser beam L is adjusted to a predetermined magnification by the second focusing optical lenses 50, 52, and guided to the board F.

The exposure stage 18 moves along the bed 14. A desired image is recorded on the board F by the DMDs 36 having the exposure heads 24a through 24j that are arrayed in the direction perpendicular to the direction in which the exposure stage 18 moves.

According to the above embodiment, as described above, there is provided a frame data producing apparatus (the exposure apparatus 72) for use in the exposure recording apparatus 10 as an image recording apparatus for forming an image on an image recording surface by relatively moving the DMDs 36 each having a plurality of micromirrors 40 as a plurality of image recording dot forming elements for forming an image recording dot group of a plurality of image recording dots on the image recording surface of the board F, in the direction indicated by the arrow Y which is a predetermined scanning direction over the image recording surface, and successively supplying frame data for each of the DMDs 36 to the DMD 36 as the image recording unit moves in the scanning direction to cause the DMDs 36 to form the image recording dot group on the image recording surface on a chronological basis, the frame data producing apparatus comprising the image data generator 70 as a micromirror-specific data generator (image recording dot forming element-specific data generator) for generating micromirror-specific data 106 to be successively supplied to the respective micromirrors 40 from the image data 102 (or the image data 104) corresponding to the image to be formed on the image recording surface, and the frame data generator 92 for generating the intermediate data 114 including extracted data change points of the micromirror-specific data 106 and thereafter generating the frame data 116 by inverting the data with respect to the data change points of the intermediate data 114.

According to the above embodiment, furthermore, a frame data producing method applicable to the exposure recording apparatus 10 as an image recording apparatus for forming an image on an image recording surface by relatively moving the DMDs 36 each having the micromirrors 40 as a plurality of image recording dot forming elements for forming an image recording dot group of a plurality of image recording dots on the image recording surface of the board F, in the direction indicated by the arrow Y which is a predetermined scanning direction over the image recording surface, and successively supplying frame data for each of the DMDs 36 to the DMD 36 as the image recording unit moves in the scanning direction to cause the DMDs 36 to form the image recording dot group on the image recording surface on a chronological basis, the frame data producing method comprising a micromirror-specific data generating step (image recording dot forming element-specific data generating step) S4 for generating micromirror-specific data 106 to be successively supplied to the respective plural micromirrors 40 from the image data 102 (or the image data 104) corresponding to the image to be formed on the image recording surface, and a frame data generating step S5 for generating the intermediate data 114 including extracted data change points of the micromirror-specific data 106 and thereafter generating the frame data 116 by inverting the data with respect to the data change points of the intermediate data 114.

According to the present embodiment, the micromirror-specific data 106 to be successively supplied to the plural micromirrors 40 are generated from the image data 102 (or the image data 104) corresponding to the image to be formed on the image recording surface by the DMDs 36 having the plural micromirrors 40, data change points of the generated micromirror-specific data 106 are extracted to generate the intermediate data 114, and the micromirror-specific data 106 are transposed to the frame data 116 for each of the DMDs 36 by inverting the data with respect to the data change points of the generated intermediate data 114. Therefore, the transposition process can be performed quickly and simply.

Since the micromirror-specific data 106 are compressed data, the storage capacity of the memory 84 for storing them may be small. The process of transposing and decompressing the micromirror-specific data 106 to the frame data 116 for each of the DMDs 36 can be performed quickly by extracting the data change points of the compressed data to generate the intermediate data 114 and inverting the data with respect to the data change points of the generated intermediate data 114.

The compressed data may comprise run-length compressed data, accumulated data thereof, or the like. The compressed data should preferably be lossless compressed data.

For inverting the data with respect to the data change points of the generated intermediate data 114 to generate the frame data 116, if the frame data for each of the DMDs 36 to be supplied to the DMD 36 at a certain time point is represented by Fn and frame data to be supplied to each of the DMDs 36 at a time point preceding the certain time point is represented by Fn−1, then the frame data Fn is determined according to the expression Fn←Fn−1 XOR Fn where n=2, 3, . . . . The transposition process which employs XORing (exclusive-ORing) can be appropriately performed by way of software implementation.

The exposure recording apparatus 10 described above can be appropriately used to expose a dry film resist (DFR) in a process of manufacturing multilayer printed wiring boards (PWBs), to form a color filter in a process of manufacturing liquid crystal display (LCD) apparatus, to expose a DFR in a process of manufacturing TFTs, and to expose a DFR in a process of manufacturing plasma display panels (PDPs). The image recording unit is not limited to a spatial light modulator comprising DMDs 36, but is also applicable to image recording apparatus having ink jet recording heads.

The invention claimed is:

1. A frame data producing apparatus for use in an image recording apparatus for forming an image on an image recording surface by relatively moving image recording units each having a plurality of image recording dot forming elements for forming an image recording dot group of a plurality of image recording dots on said image recording surface, in a predetermined scanning direction over the image recording surface, and successively supplying frame data for each of said image recording units to the image recording unit as the image recording unit moves in the scanning direction to cause said image recording units to form said image recording dot group on said image recording surface on a chronological basis, said frame data producing apparatus comprising:

an image recording dot forming element-specific data generator for generating image recording dot forming element-specific data to be successively supplied to each of said image recording dot forming elements from image data corresponding to the image to be formed on said image recording surface; and a frame data generator for generating intermediate data including extracted data change points of said image recording dot forming element-specific data and thereafter generating said frame data by inverting the intermediate data with respect to said data change points of said intermediate data.

2. A frame data producing apparatus according to claim 1, wherein said image recording dot forming element-specific data comprise compressed data.

3. A frame data producing apparatus according to claim 1, wherein when said frame data generator inverts the intermediate data with respect to said data change points of said intermediate data to generate said frame data, if the frame data for each of said image recording units to be supplied to said image recording units at a certain time point is represented by Fn and frame data for each of said image recording units to be supplied to said image recording units at a time point preceding said certain time point is represented by Fn−1, then the frame data Fn is determined according to the expression:

$Fn \leftarrow Fn{-}1\, XOR\, Fn$ where $n=2,3,\ldots$

4. An image recording apparatus incorporating a frame data producing apparatus according to claim 1.

5. A frame data producing method applicable to an image recording apparatus for forming an image on an image recording surface by relatively moving image recording units each having a plurality of image recording dot forming elements for forming an image recording dot group of a plurality of image recording dots on said image recording surface, in a predetermined scanning direction over the image recording surface, and successively supplying frame data for each of said image recording units to the image recording unit as the image recording unit moves in the scanning direction to cause said image recording units to form said image recording dot group on said image recording surface on a chronological basis, said frame data producing method comprising:

an image recording dot forming element-specific data generating step of generating image recording dot forming element-specific data to be successively supplied to each of said image recording dot forming elements from image data corresponding to the image to be formed on said image recording surface; and a frame data generating step of generating intermediate data including extracted data change points of said image recording dot forming element-specific data and thereafter generating said frame data by inverting the intermediate data with respect to said data change points of said intermediate data.

6. A frame data producing method according to claim 5, wherein said image recording dot forming element-specific data comprise compressed data.

7. A frame data producing method according to claim 5, wherein when said frame data generating step inverts the intermediate data with respect to said data change points of said intermediate data to generate said frame data, if the frame data for each of said image recording units to be supplied to said image recording units at a certain time point is represented by Fn and frame data for each of said image recording units to be supplied to said image recording units at a time point preceding said certain time point is represented by Fn−1, then the frame data Fn is determined according to the expression:

$Fn \leftarrow Fn{-}1\, XOR\, Fn$ where $n=2,3,\ldots$

8. An image recording apparatus to which a frame data producing method according to claim 5 is applied.

* * * * *